US010115648B2

(12) United States Patent
Seo et al.

(10) Patent No.: US 10,115,648 B2
(45) Date of Patent: Oct. 30, 2018

(54) FAN-OUT SEMICONDUCTOR PACKAGE AND ELECTRONIC DEVICE INCLUDING THE SAME

(71) Applicant: SAMSUNG ELECTRO-MECHANICS CO., LTD., Suwon-si, Gyeonggi-do (KR)

(72) Inventors: Shang Hoon Seo, Suwon-si (KR); Seung Yeop Kook, Suwon-si (KR); Ha Young Ahn, Suwon-si (KR); Sung Won Jeong, Suwon-si (KR); Young Gwan Ko, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/342,281

(22) Filed: Nov. 3, 2016

(65) Prior Publication Data
US 2017/0148699 A1    May 25, 2017

(30) Foreign Application Priority Data

Nov. 23, 2015    (KR) .................. 10-2015-0164069
Mar. 22, 2016    (KR) .................. 10-2016-0034178

(51) Int. Cl.
*H01L 21/00*    (2006.01)
*H01L 23/02*    (2006.01)
(Continued)

(52) U.S. Cl.
CPC .... *H01L 23/3128* (2013.01); *H01L 23/49838* (2013.01); *H01L 24/19* (2013.01); *H01L 24/20* (2013.01); *H01L 2224/04105* (2013.01); *H01L 2224/12105* (2013.01); *H01L 2224/16227* (2013.01); *H01L 2224/32225* (2013.01);
(Continued)

(58) Field of Classification Search
CPC .................. H01L 23/3128; H01L 2924/18162
See application file for complete search history.

(56) References Cited

U.S. PATENT DOCUMENTS

2010/0078786 A1 * 4/2010  Maeda ................ H01L 23/16
                                                            257/678
2010/0140771 A1 * 6/2010  Huang ................ H01L 21/6835
                                                            257/686
(Continued)

FOREIGN PATENT DOCUMENTS

JP       2000-277556 A    10/2000
KR    10-2004-0083192 A    10/2004
KR    10-2013-0132162 A    12/2013

*Primary Examiner* — Joseph C Nicely
*Assistant Examiner* — Wilner Jean Baptiste
(74) *Attorney, Agent, or Firm* — McDermott Will & Emery LLP

(57) ABSTRACT

A fan-out semiconductor package and an electronic device including the same are provided. The fan-out semiconductor package includes a semiconductor chip; an interconnection member electrically connected to the semiconductor chip and having a connection terminal pad; and a passivation layer disposed at one side of the interconnection member and having an opening part opening a portion of the connection terminal pad. Distances from a center of the connection terminal pad to at least two points of an edge thereof are different from each other.

22 Claims, 18 Drawing Sheets

(51) Int. Cl.
*H01L 23/31* (2006.01)
*H01L 23/498* (2006.01)
*H01L 23/00* (2006.01)

(52) U.S. Cl.
CPC ........... *H01L 2224/73204* (2013.01); *H01L 2225/1035* (2013.01); *H01L 2225/1058* (2013.01); *H01L 2924/15311* (2013.01); *H01L 2924/18162* (2013.01); *H01L 2924/3511* (2013.01); *H01L 2924/3512* (2013.01)

(56) References Cited

U.S. PATENT DOCUMENTS

| | | | | |
|---|---|---|---|---|
| 2011/0031619 | A1* | 2/2011 | Chen | H01L 21/563 257/738 |
| 2011/0204513 | A1* | 8/2011 | Meyer | H01L 21/568 257/738 |
| 2013/0069219 | A1* | 3/2013 | Uchiyama | H01L 25/03 257/734 |
| 2014/0070396 | A1* | 3/2014 | Kyozuka | H01L 24/19 257/698 |

* cited by examiner

FAN-OUT SEMICONDUCTOR PACKAGE AND ELECTRONIC DEVICE INCLUDING THE SAME

CROSS-REFERENCE TO RELATED APPLICATIONS

This application claims benefit of priority to Korean Patent Application No. 10-2015-0164069, filed on Nov. 23, 2015 with the Korean Intellectual Property Office, and Korean Patent Application No. 10-2016-0034178, filed on Mar. 22, 2016 with the Korean Intellectual Property Office, the disclosures of which are incorporated herein by reference.

TECHNICAL FIELD

The present disclosure relates to a fan-out semiconductor package and an electronic device including the same.

BACKGROUND

A semiconductor package is defined as package technology for electrically connecting an electronic component to a printed circuit board (PCB), such as a main board of an electronic device, or the like, and protecting the electronic component from external impacts, and is distinguished from technology in which an electronic component is embedded in a printed circuit board, such as an interposer substrate. Meanwhile, one recent main trend in the development of technology related to electronic components is to reduce the size of electronic components. As such, in the package field, and in accordance with a rapid increase in demand for miniaturized electronic components, or the like, implementation of a semiconductor package having a compact size and including a plurality of pins has been demanded.

One package technology suggested in order to satisfy the technical demand as described above is a wafer level package (WLP) using a redistribution layer of an electrode pad of an electronic component formed on a wafer. An example of the wafer level package includes a fan-in wafer level package and a fan-out wafer level package. In particular, the fan-out wafer level package has a compact size and is advantageous in implementing a plurality of pins. Therefore, recently, the fan-out wafer level package has been actively developed.

Meanwhile, generally, in a case in which the electronic component package is mounted on the main board of the electronic device, or the like, since a difference between coefficients of thermal expansion (CTE) of the electronic component and the main board is significantly large, a difference between effective coefficients of thermal expansion of the electronic component package and the main board is intensified. As a result, in a case in which the electronic component package mounted on the main board is exposed to severe environments, cracks may be generated in a connection terminal, for example, a solder ball, connecting the electronic component package and the main board to each other.

SUMMARY

An aspect of the present disclosure may provide a new electronic component package of which board level reliability is improved, and an electronic device including the same.

According to one of several aspects of the present disclosure, a shape of a connection terminal pad may be changed into a non-circular shape.

According to an aspect of the present disclosure, a fan-out semiconductor package may include: component semiconductor chip; an interconnection member electrically connected to the semiconductor chip and having a connection terminal pad; and a passivation layer disposed at one side of the interconnection member and having an opening part opening a portion of the connection terminal pad. Distances from a center of the connection terminal pad to at least two points of an edge thereof are different from each other.

According to another aspect of the present disclosure, an electronic device may include: a board; and a fan-out semiconductor package mounted on the board. The fan-out semiconductor package includes a semiconductor chip, an interconnection member electrically connected to the semiconductor chip and having a connection terminal pad, and a passivation layer disposed at one side of the interconnection member and having an opening part opening a portion of the connection terminal pad. Distances from a center of the connection terminal pad to at least two points of an edge thereof are different from each other.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Hereinafter, the present disclosure will be described with reference to the accompanying drawings. In the accompanying drawings, shapes and dimensions of components may be exaggerated and shortened for clarity.

Electronic Device

Figure 1:
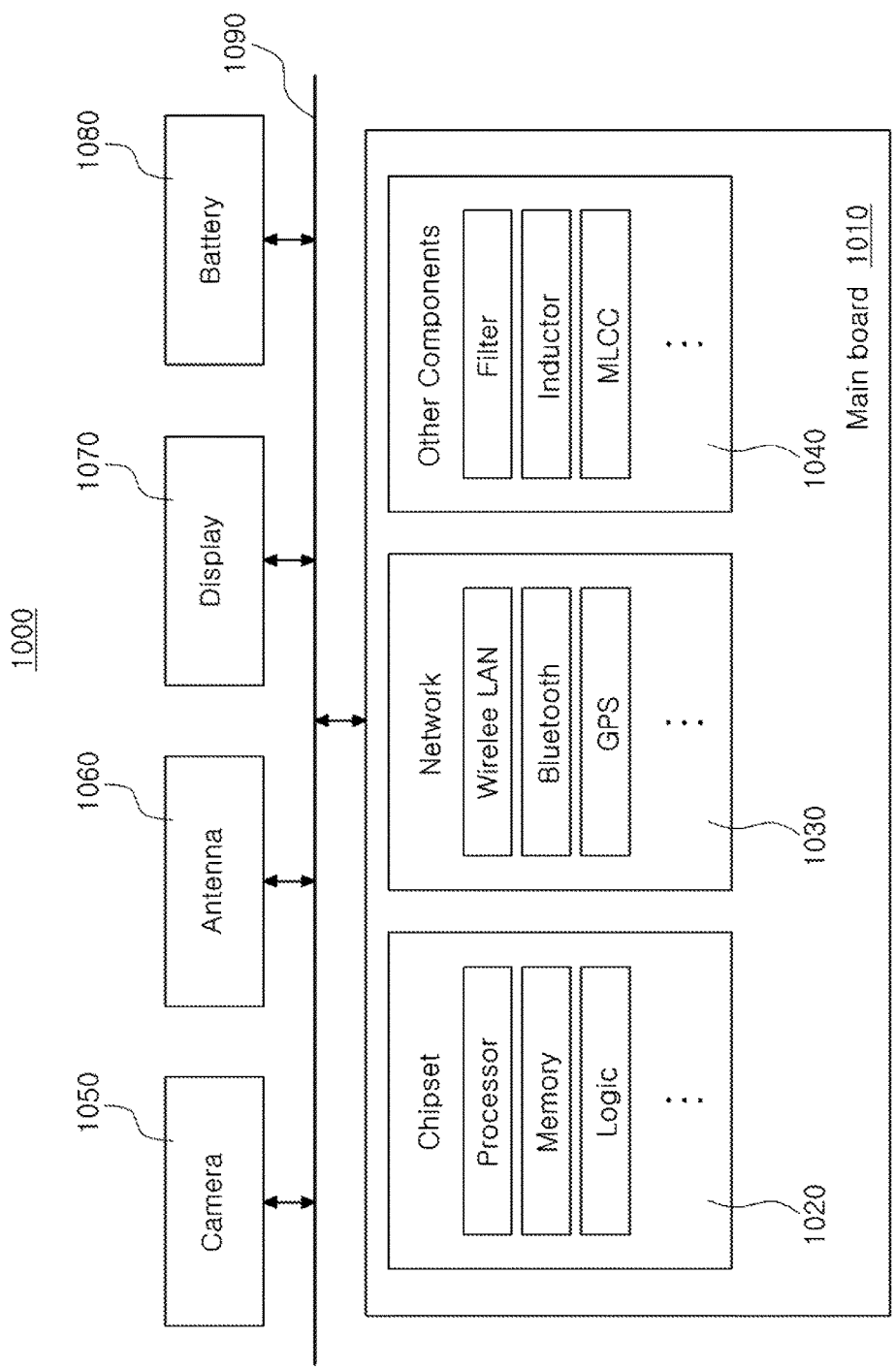
FIG. 1 is a schematic block diagram illustrating an example of an electronic device system.

FIG. 1 is a schematic block diagram illustrating an example of an electronic device system;

Referring to FIG. 1, an electronic device 1000 may accommodate a main board 1010 therein. Chip related components 1020, network related components 1030, other components 1040, and the like, may be physically and/or electrically connected to the main board 1010. These components may be connected to other components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, etc.; an application processor chip such as a central processor (for example, a central processing unit (CPU)), a graphics processor (for example, a graphic processing unit (GPU)), a digital signal processor, a cryptographic processor, a micro processor, a micro controller, etc.; a logic chip such as an analog-to-digital converter, an application-specific integrated circuit (ASIC), etc., and the like. However, the chip related components 1020 are not limited thereto, and may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network related components 1030 are not limited thereto, and may also include any of a plurality of other wireless or wired standards or protocols. In addition, these components 1030 may be combined with each other together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, these components 1040 may be combined with each other together with the chip related components 1020 and/or the network related components 1030 described above.

The electronic device 1000 may include other components that are or are not physically and/or electrically connected to the main board 1010 depending on a kind thereof. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage (for example, a hard disk drive) (not illustrated), a compact disk (CD) (not illustrated), a digital versatile disk (DVD) (not illustrated), and the like. However, these other components are not limited thereto, and may also include other components used for various purposes depending on a kind of electronic device 1000.

The electronic device 1000 may be a smartphone, a personal digital assistant, a digital video camera, a digital still camera, a network system, a computer, a monitor, a tablet, a laptop, a netbook, a television, a video game console, a smart watch, or the like. However, the electronic device 1000 is not limited thereto, and may also be any other electronic device processing data.

Figure 2:
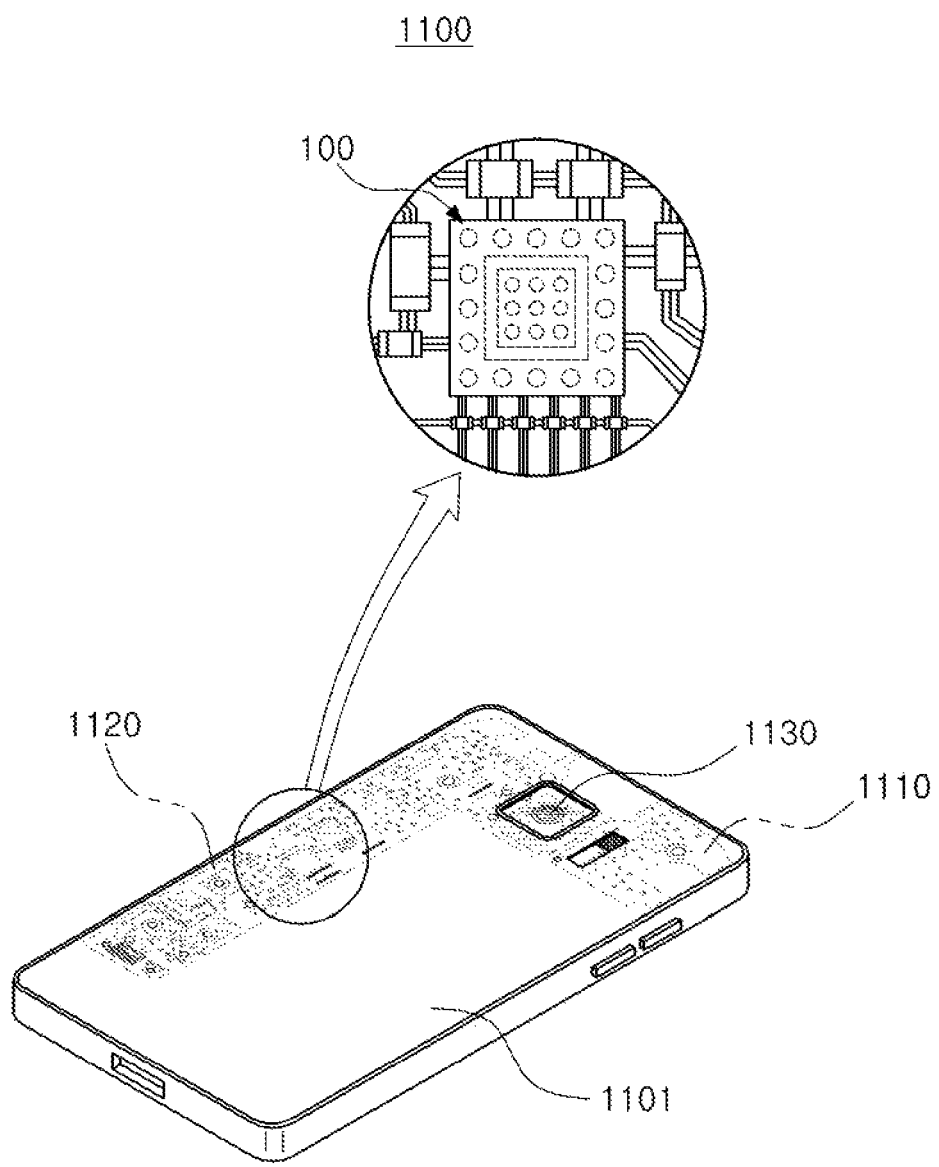
FIG. 2 is a schematic perspective view illustrating an example of an electronic device.

FIG. 2 is a schematic perspective view illustrating an example of an electronic device;

The semiconductor package may be used for various purposes in the various electronic devices 1000 as described above. For example, a main board 1110 may be accommodated in a body 1101 of a smartphone 1100, and various electronic components 1120 may be physically and/or electrically connected to the main board 1110. In addition, another component that may be or may not be physically and/or electrically connected to the main board 1110, such as a camera 1130, may be accommodated in the body 1101. Here, some of the electronic components 1120 may be the chip related components as described above, and the electronic component package 100 may be, for example, an application processor among the chip related components, but are not limited thereto.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
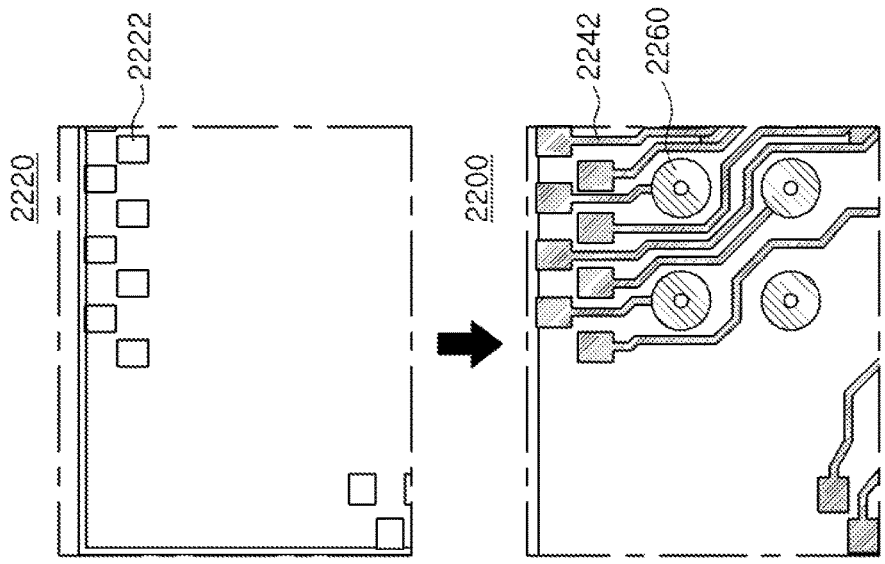
FIGS. 3A and 3B are schematic cross-sectional views illustrating states of a fan-in semiconductor package before and after being packaged.
Figure 3A:
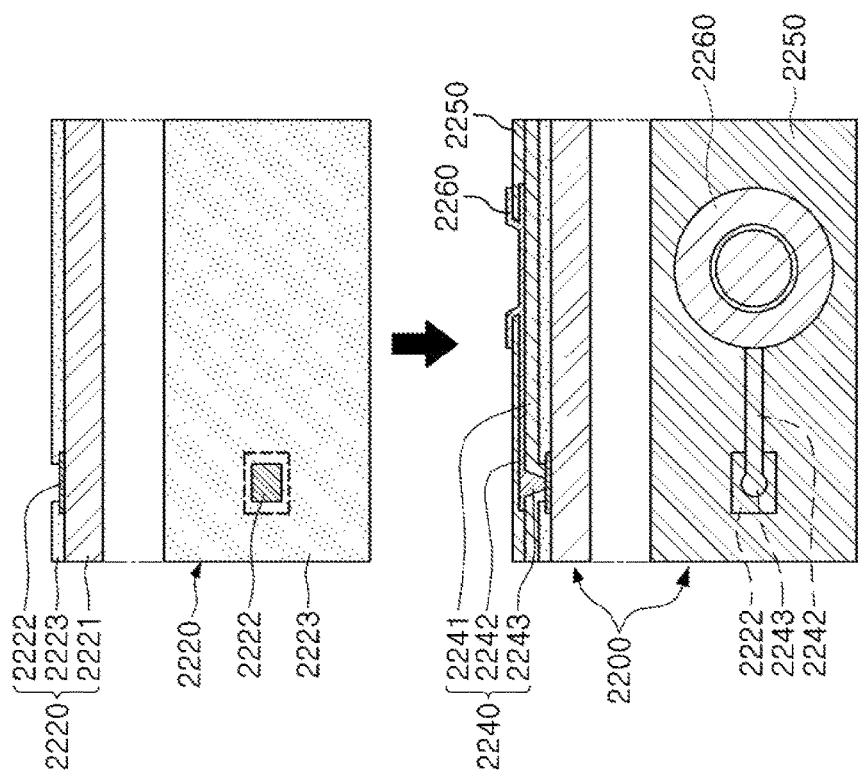

FIGS. 3A and 3B are schematic cross-sectional views illustrating states of a fan-in semiconductor package before and after being packaged.

Figure 4:
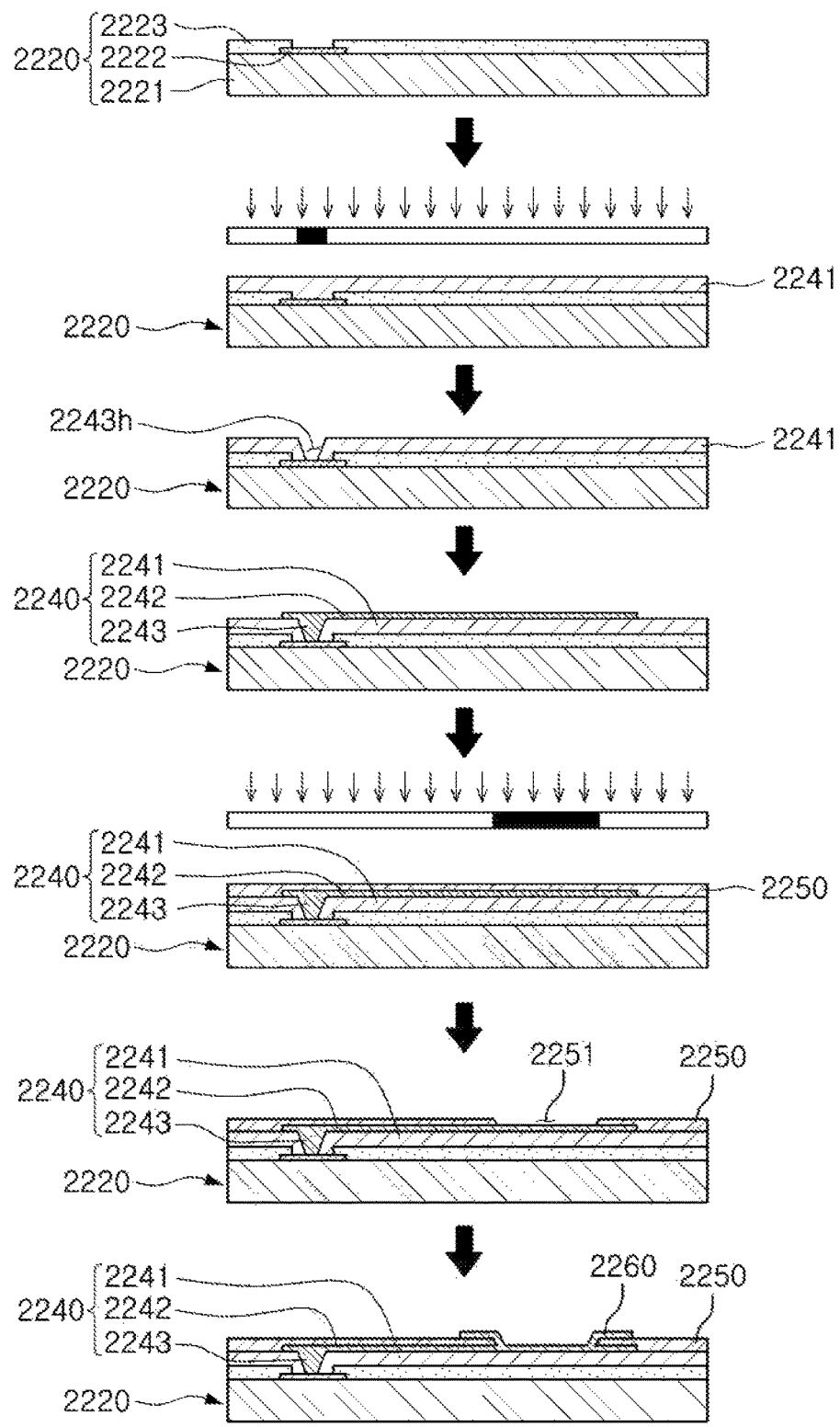
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming redistribution layers 2242 and vias 2243. Then, a passivation layer 2250 protecting the connection member 2240 may be formed, an opening 2251 may be formed, and an under-bump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
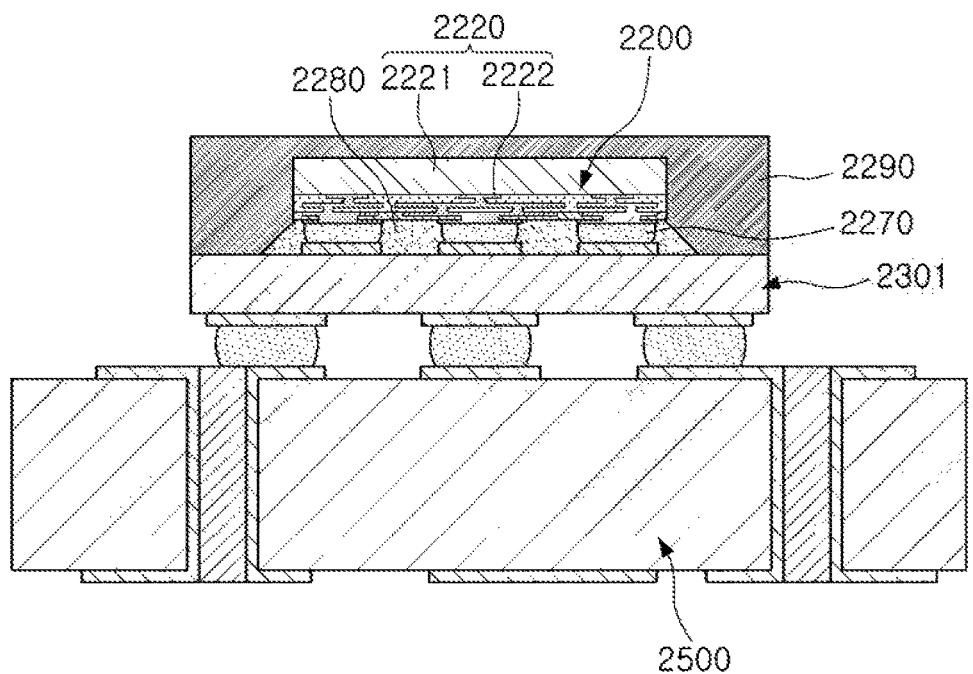
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
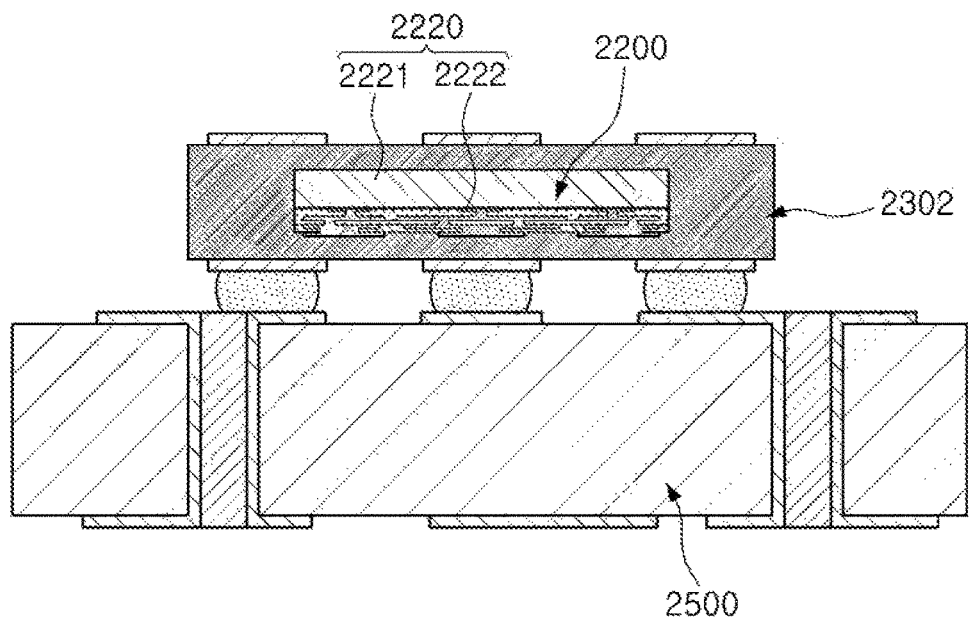
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
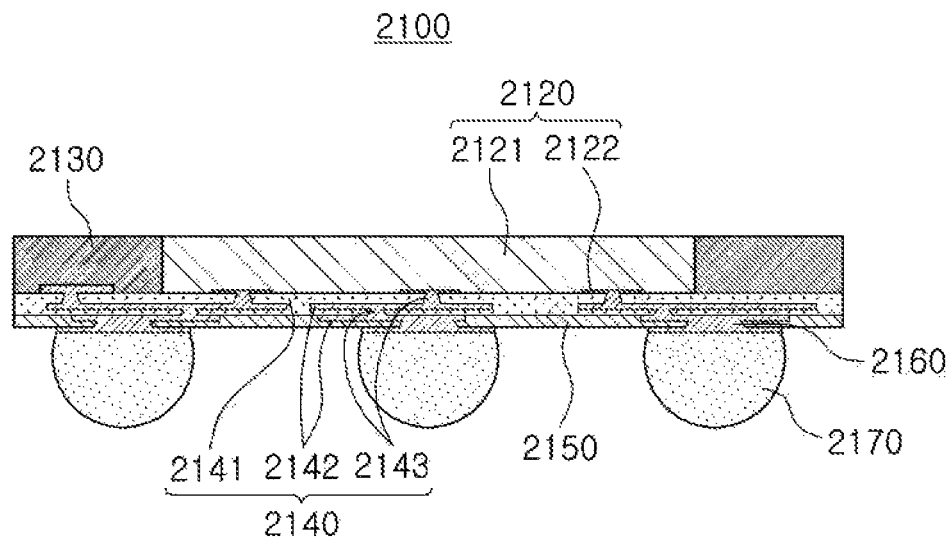
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an under-bump metal layer 2160 may be further formed in openings of the passivation layer 2150. Solder balls 2170 may be further formed on the under-bump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
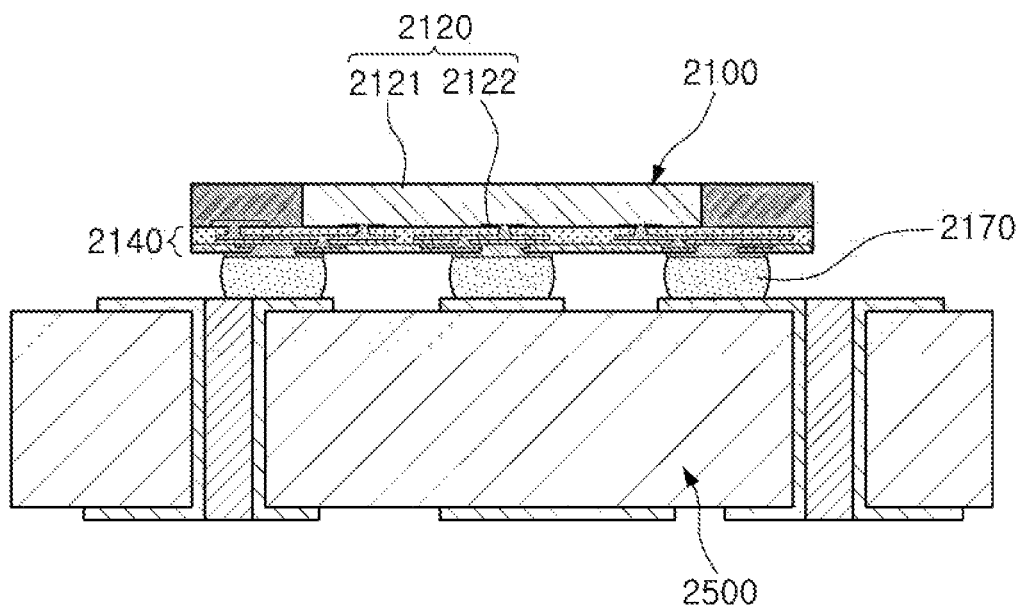
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
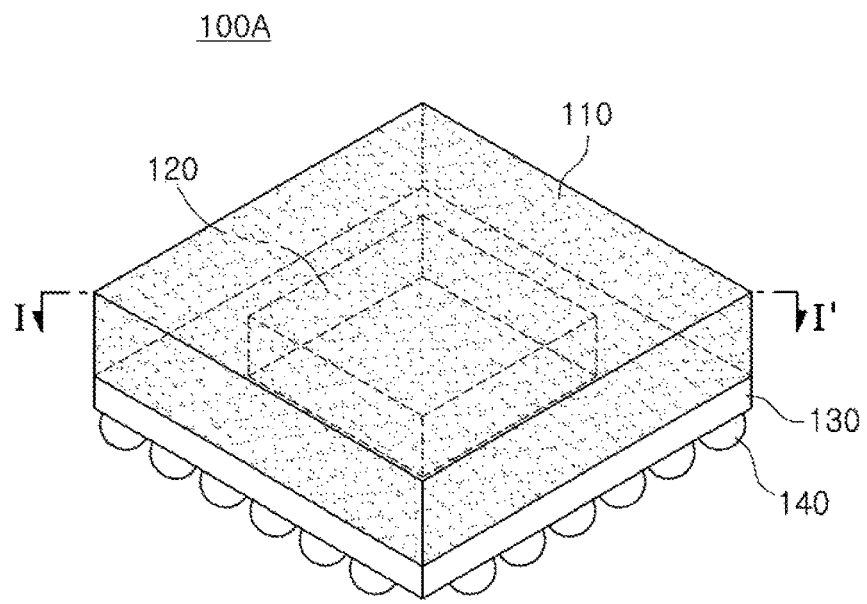
FIG. 9 is a perspective view schematically illustrating an example of a fan-out semiconductor package.

FIG. 9 is a perspective view schematically illustrating an example of a fan-out semiconductor package.

Figure 10:
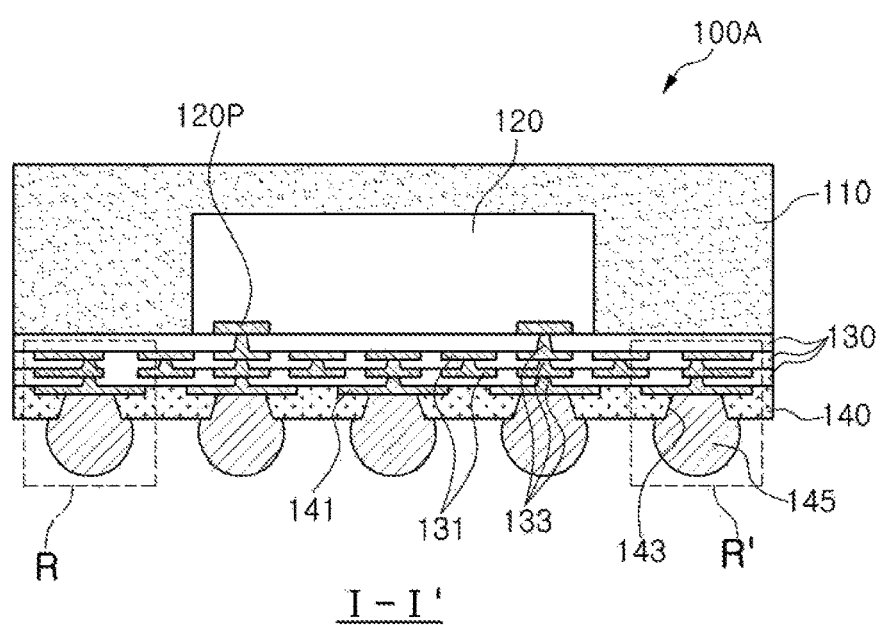
FIG. 10 is a schematic cross-sectional view of the electronic component package taken along line I-I' of FIG. 9.

FIG. 10 is a schematic cross-sectional view of the electronic component package taken along line I-I' of FIG. 9.

FIGS. 11A through 11D are plan views schematically illustrating an example of a region R or R' in FIG. 10.

FIGS. 12A through 12D are plan views schematically illustrating another example of a region R or R' in FIG. 10.

Referring to FIGS. 9 through 12D, a fan-out semiconductor package 100A according to an example may include an electronic component 120; a first interconnection member electrically connected to the electronic component 120 and having connection terminal pads 141; and a passivation layer 140 disposed at one side of the first interconnection member and having opening parts 143 opening at least portions of the connection terminal pads 141. In addition, the electronic component package 100A according to an example may include connection terminals 145 disposed in the opening parts 143 of the passivation layer 140 and connected to the connection terminal pads 141, if necessary. The connection terminal pads 141 disposed in at least regions R and R' in which stress is concentrated among the connection terminal pads 141 may have a non-circular shape. For example, distances D1 and D2 from the center of the connection terminal pads 141 to at least two points of an edge thereof may be different from each other.

Generally, in a case in which the electronic component package is mounted on the main board of the electronic device, or the like, since a difference between coefficients of thermal expansion (CTE) of the electronic component and the main board is significantly large (in a case in which the electronic component is an Si based integrated circuit, a CTE of the electronic component is approximately 3 ppm, and a CTE of the main board is approximately 20 to 30 ppm), a difference between effective coefficients of thermal expansion of the electronic component package and the main board may become significantly large. As a result, in a case in which the electronic component package mounted on the main board is exposed to severe environments, cracks may be generated in a connection terminal, for example, a solder ball, connecting the electronic component package and the main board to each other. That is, warpage may be generated in the electronic component package and the main board due to the difference between the CTE of the electronic component and the main board. Here, the warpage generated in the electronic component package and the warpage generated in the main board act in opposite directions, and thus stress may be concentrated on the connection terminal, for example, the solder ball, connecting the electronic component package and the main board to each other. As a result, cracks may be generated.

Conversely, in a case in which the connection terminal pads 141 disposed in at least the regions R and R' in which the stress is concentrated among the connection terminal pads 141 are implemented in a non-circular shape as in the electronic component package 100A according to an example, areas of the connection terminal pads 141 supporting the connection terminals 145 may be increased, and adhesion between the connection terminal pads 141 and the connection terminals 145 may be increased, which is effective in dispersing stress. In addition, an anchoring effect may be expected by, for example, protrusion parts 141P or angled parts 141C. Therefore, even in a case in which warpage is generated in the electronic component package and the main board due to the difference between the CTE of the electronic component and the main board, generation of cracks in the connection terminals 145 may be prevented.

Hereinafter, respective components of the electronic component package 100A according to an example will be described in more detail.

The electronic component 120 may be various active components (such as a diode, a vacuum tube, a transistor, and the like) or passive components (such as an inductor, a condenser, a resistor, and the like). Alternatively, the electronic component 120 may be an integrated circuit (IC) indicating a chip in which hundreds to millions or more of elements are integrated. The integrated circuit may be an application processor chip such as a central processor (such as a CPU), a graphics processor (such as a GPU), a digital signal processor, a cryptographic processor, a micro processor, a micro controller, or the like, but is not limited thereto.

The electronic component 120 may have electrode pads 120P electrically connected to the first interconnection member. The purpose of the electronic pad 120P may be to electrically externally connect the electronic component 120, and a material of the electrode pad 120P is not particularly limited as long as it is a conductive material. The conductive material may be copper (Cu), aluminum (Al), silver (Ag), tin (Sn), gold (Au), nickel (Ni), lead (Pb), titanium (Ti), or alloys thereof, but is not limited thereto. The electrode pads 120P may be redistributed by the first interconnection member. The electrode pad 120P may have an embedded form or a protruding form.

In the case in which the electronic component 120 is the integrated circuit, the electronic component may have a body (not denoted by a reference number), a passivation layer (not denoted by a reference number), and the electrode pads 120P. The body may be formed on the basis of, for example, an active wafer. In this case, silicon (Si), germanium (Ge), gallium arsenide (GaAs), or the like, may be used as a basic material of the body. The passivation layer may serve to protect the body from external factors, and may be formed of, for example, an oxide layer, a nitride layer, or the like, or may be formed of a double layer of an oxide layer and a nitride layer. A conductive material such as copper (Cu), aluminum (Al), silver (Ag), tin (Sn), gold (Au), nickel (Ni), lead (Pb), titanium (Ti), or alloys thereof, may be used as a material of the electrode pad 120P. A layer on which the electrode pads 120P are formed may become an active layer.

A thickness of the electronic component 120 in a cross section thereof is not particularly limited, and may be changed depending on a kind of electronic component 120. For example, in a case in which the electronic component is the integrated circuit, a thickness of the electronic component may be about 100 μm to 480 μm, but is not limited thereto. The thickness of the electronic component 120 in the cross-section thereof may be the same as or thinner than that of a second interconnection member 115 in a cross-section thereof to be described below. In this case, the electronic component 120 may be more easily protected.

The purpose of the first interconnection member may be to redistribute the electrode pads 120P of the electronic component 120. Tens to hundreds of electrode pads 120P having various functions may be redistributed through the first interconnection member, and may be physically and/or electrically externally connected through the connection terminals 145 depending on functions thereof. The first interconnection member may include insulating layers 130, various kinds of redistribution layers 131, 141, and 142 disposed on the insulating layers 130, and vias 133 penetrating through the insulating layers 130. The first interconnection member is not necessarily formed of a plurality of layers, and may also be formed of a single layer in some cases. That is, the first interconnection member may include only one insulating layer, one layer of a redistribution layer disposed on the insulating layer, and one layer of vias penetrating through the insulating layer. In addition, the first interconnection member is not necessarily formed of two layers, and may also be formed of a plurality of layers more than two layers.

An insulating material may be used as a material of the insulating layer 130. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, Ajinomoto Build up Film (ABF), FR-4, Bismaleimide Triazine (BT), or the like. In a case in which a photosensitive insulating material such as a photo imagable dielectric (PID) resin is used as a material of the insulating layer 130, the insulating layer 130 may be formed at a reduced thickness, and a fine pitch may be easily implemented. The respective insulating layers 130 may be formed of the same insulating material or different insulating materials. In a case in which the respective insulating layers 130 are formed of the same insulating material, boundaries between the respective insulating layers 130 may not be apparent in some case, but are not necessarily limited thereto.

A first redistribution layer 131 may serve as redistribution, or the like, and a conductive material such as copper (Cu), aluminum (Al), silver (Ag), tin (Sn), gold (Au), nickel (Ni), lead (Pb), titanium (Ti), or alloys thereof, may be used as a material of the first redistribution layer 131. The first redistribution layer 131 may perform various functions depending on a design of the corresponding layers. For example, the first redistribution layer 131 may serve as a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the first redistribution layer 131 may also serve as pads such as via pads, or the like.

A second redistribution layer 141 may serve as a pad of the connection terminal 145. That is, the second redistribution layer 141 may be the connection terminal pad 141. Here, the connection terminal pads 141 disposed in at least the regions R and R' in which stress is concentrated may be implemented in a shape that is not a simple circular shape. For example, the distances D1 and D2 from the center of the connection terminal pads 141 to at least two points of the edge thereof may be different from each other. Therefore, as described above, a more excellent stress dispersing effect, anchoring effect, and the like, may be achieved.

For example, as illustrated in FIGS. 11A through 11D, the connection terminal pads 141 may have a plurality of protrusion parts 141P on the same plane. The areas of the connection terminal pads 141 supporting the connection terminals 145 may be increased by the plurality of protrusion parts 141P. In addition, more excellent adhesion between the connection terminal pads 141 and the connection terminals 145 may be implemented. In addition, the anchoring effect may be provided through the plurality of protrusion parts 141P. As a result, board level reliability may be improved.

Figure 11A:
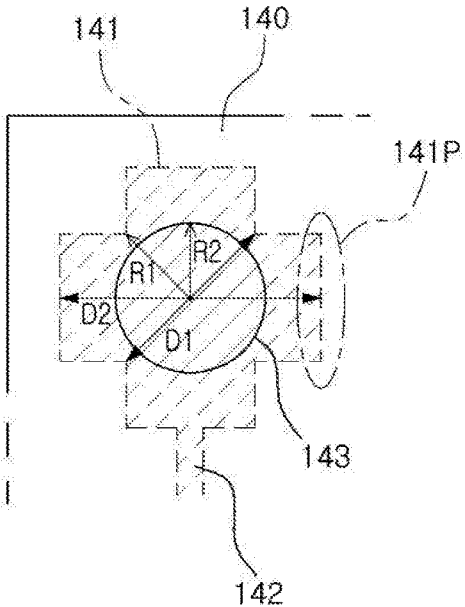
FIGS. 11A through 11D are plan views schematically illustrating an example of a region R or R'.
Figure 11B:
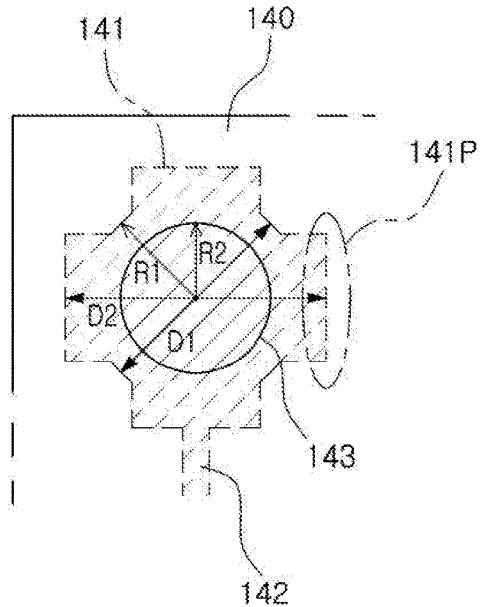
Figure 11C:
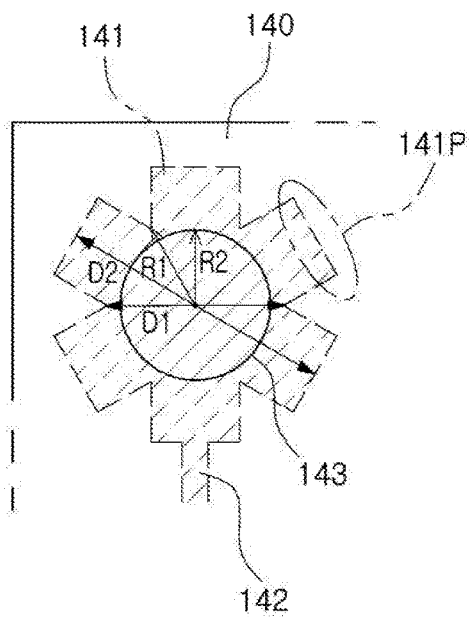
Figure 11D:
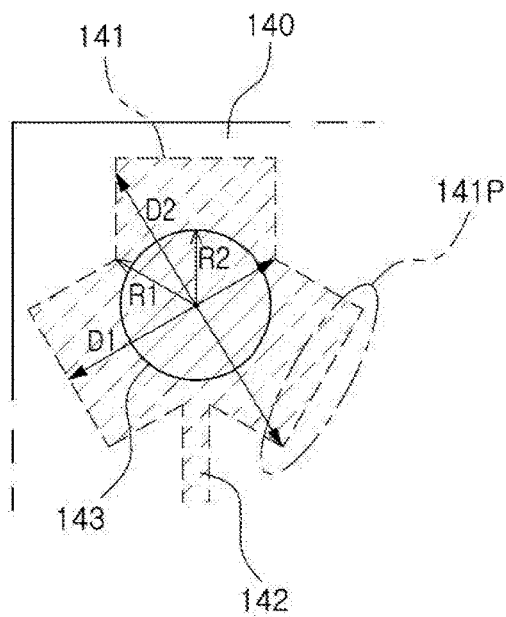

A shape of the plurality of protrusion parts 141P is not particularly limited as long as the plurality of protrusion parts 141P protrude in different directions on the same plane in relation to the centers of the connection terminal pads 141. For example, the plurality of protrusion parts 141P may have a shape in which they protrude in four different directions in relation to the rectangular centers (for example, across shape), as illustrated in FIG. 11A, may have a shape in which they protrude in four different directions in relation to the circular centers (for example, a modified cross shape), as illustrated in FIG. 11B, may have a shape in which they protrude in six different directions in relation to the hexagonal centers (for example, a cosmos shape), as illustrated in FIG. 11C, or may have a shape in which they protrude in three different directions in relation to the triangular centers (for example, a windmill shape), as illustrated in FIG. 11D. However, the plurality of protrusion parts 141P are not limited to having the shapes described above, and may also have a combination of the shapes described above or another modified shape. The number of protrusion parts 141P is not particularly limited, and may be three or more protruding in different directions on the same plane. It may be more advantageous in stress alleviation, the anchoring effect, and the like, that the number of protrusion parts 141P protruding in the different directions on the same plane is three or more. As a result, it may be more advantageous in improvement of the board level reliability that the number of protrusion parts 141P protruding in the different directions on the same plane is three or more.

All end portions of the plurality of protrusion parts 141P may be covered by the passivation layer 140. It may be more advantageous in stress alleviation, the anchoring effect, and the like, that most of the areas of the plurality of protrusion parts 141P are covered by the passivation layer 140. As a result, it may be more advantageous in the improvement of the board level reliability that most of the areas of the plurality of protrusion parts 141P are covered by the passivation layer 140. When a distance from the center of the connection terminal pad 141 having the plurality of protrusion parts 141P to an edge of the connection terminal pad 141 is R1 and a longest distance from the center of the connection terminal pad 141 having the plurality of protrusion parts 141P to an edge of the opening part 143 is R2, R1 may be the same as or larger than R2. For example, the opening part 143 may be a solder mask defined type. That is, the passivation layer 140 may cover most of the edge of the connection terminal pad 141. This case may be more advantageous in stress alleviation, the anchoring effect, and the like, as described above.

Alternatively, as illustrated in FIGS. 12A through 12D, the connection terminal pad 141 may be a polygonal shape, when viewed from the above, i.e., in a stacking direction of the electronic component and the first interconnection member or in a direction opposite to the stacking direction. In this case, similarly, the areas of the connection terminal pads 141 supporting the connection terminals 145 may be increased by a plurality of angled parts 141C. In addition, more excellent adhesion between the connection terminal pads 141 and the connection terminals 145 may be implemented. In addition, the anchoring effect may be provided through the plurality of angled parts 141C. As a result, board level reliability may be improved.

Figure 12A:
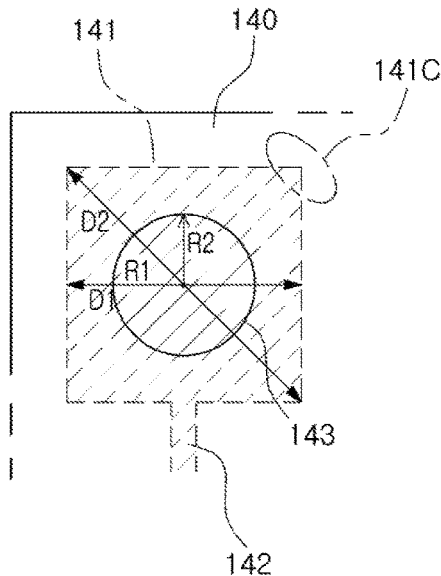
FIGS. 12A through 12D are plan views schematically illustrating another example of a region R or R'.
Figure 12B:
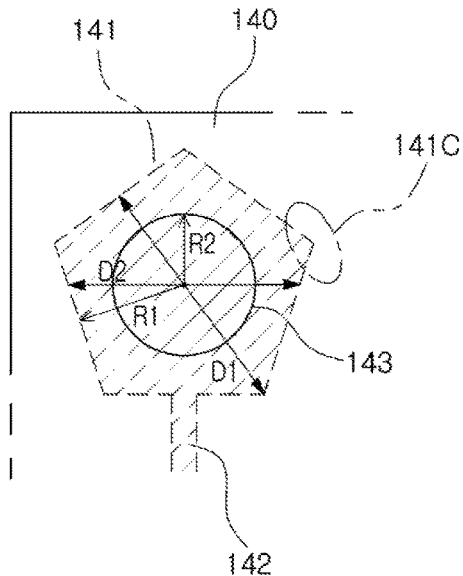
Figure 12C:
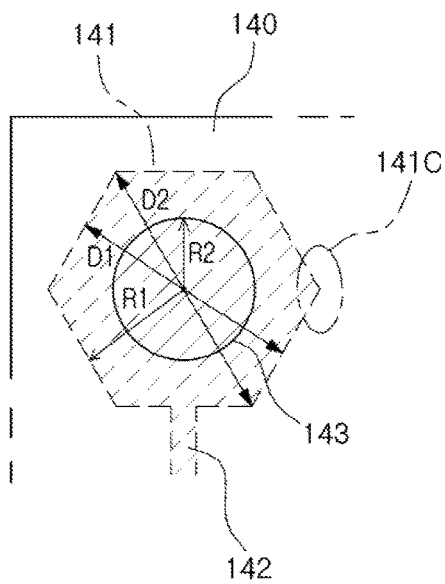
Figure 12D:
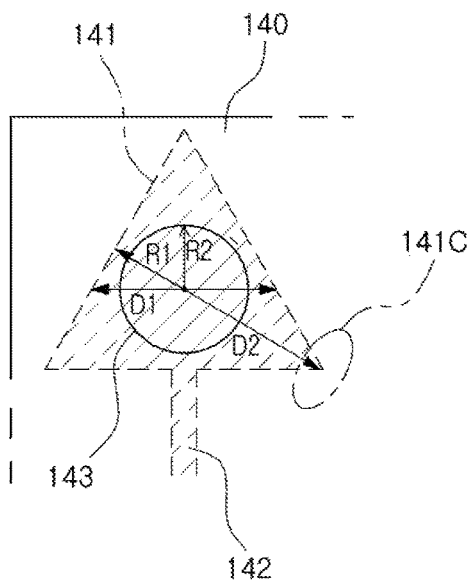

A detailed form of the polygonal shape is not particularly limited. For example, the polygonal shape may be a quadrangular shape as illustrated in FIG. 12A or a pentagonal shape as illustrated in FIG. 12B. In addition, the polygonal shape may be a hexagonal shape as illustrated in FIG. 12C or a triangular shape as illustrated in FIG. 12D. However, the polygonal shape is not limited to the shapes described above, and may be a combination of the shapes described above or a polygonal shape different from the shapes described above.

All of the plurality of angled parts 141C may be covered by the passivation layer 140. It may be more advantageous in stress alleviation, the anchoring effect, and the like, that the plurality of angled parts 141C are covered by the passivation layer 140. As a result, it may be more advantageous in the improvement of the board level reliability that the plurality of angled parts 141C are covered by the passivation layer 140. When a distance from the center of the connection terminal pad 141 having the polygonal shape to an edge of the connection terminal pad 141 is R1 and a longest distance from the center of the connection terminal pad 141 having the polygonal shape to an edge of the opening part 143 is R2, R1 may be the same as or larger than R2. For example, the opening part 143 may be a solder mask defined type. That is, the passivation layer 140 may cover most of the edge of the connection terminal pad 141. This case may be more advantageous in stress alleviation, the anchoring effect, and the like, as described above.

A third redistribution layer 142 may be connected to the second redistribution layer 141, and may serve as a ground (GND) pattern, a power (PWR) pattern, a signal (S) pattern, and the like. A conductive material such as copper (Cu), aluminum (Al), silver (Ag), tin (Sn), gold (Au), nickel (Ni), lead (Pb), titanium (Ti), or alloys thereof, may be used as materials of the second and third redistribution layers 141 and 142. The second redistribution layer 141 and the third redistribution layer 142 may be integrally formed. A boundary between the second redistribution layer 141 which is the connection terminal pad and the third redistribution layer 142 is a portion where a width of the integrally formed redistribution layer dramatically increases from a width of the third redistribution layer 142 to a width of the protrusion part 141P as shown in FIGS. 11A-11D or to a width of an edge of polygonal shape as shown in FIGS. 12A-12D. A surface treatment layer may be further formed on exposed regions of the second redistribution layer 141, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 133 may electrically connect redistribution layers 131, 141, and 122 formed on different layers, the electrode pads 120P, and the like, to each other, thereby forming an electrical path within the electronic component package 100A. A conductive material such as copper (Cu), aluminum (Al), silver (Ag), tin (Sn), gold (Au), nickel (Ni), lead (Pb), titanium (Ti), or alloys thereof, may be used as a material of the via 133. The via 133 may be completely filled with a conductive material. Alternatively, a conductive material may be formed along a wall of the via. In addition, the via 133 may have all of the shapes known in the related art, such as a tapered shape in which a diameter of the via becomes smaller toward a lower surface, a reverse tapered shape in which a diameter of the via becomes larger toward a lower surface, a cylindrical shape, and the like.

The purpose of the passivation layer 140 may be to protect the first interconnection member from external physical and chemical damage, or the like. A material of the passivation layer 140 is not particularly limited. For example, a solder resist may be used as a material of the passivation layer 140. That is, the passivation layer 140 may be a solder resist layer. In addition, the same material as that of the insulating layer 130 of the first interconnection member, such as the same PID resin, may also be used as a material of the passivation layer 140. The passivation layer 140 is generally a single layer, but may also be formed of multiple layers, if necessary. The passivation layer 140 may have the opening parts 143 opening at least portions of the connection terminal pads 141. The opening part 143 may have a circular shape or an oval shape, when viewed from above, but is not limited thereto.

The purpose of the connection terminals 145 may be to physically and/or electrically externally connect the electronic component package 100A. For example, the electronic component package 100A may be mounted on the main board of the electronic device through the connection terminals 145. The connection terminals 145 may be disposed on the opening parts 143, and may be connected to the connection terminal pads 141 exposed through the opening parts 143. Therefore, the connection terminals 145 may also be electrically connected to the electronic component 120.

The connection terminal 145 may be formed of a conductive material, such as copper (Cu), aluminum (Al), silver (Ag), tin (Sn), gold (Au), nickel (Ni), lead (Pb), solder, or the like, but is not particularly limited thereto. The connection terminal 145 may be a land, a ball, a pin, or the like. The connection terminal 145 may be formed of multiple layers or a single layer. In a case in which the connection terminal 145 is formed of multiple layers, the connection terminal 145 may contain a copper pillar and a solder, and in a case in which the connection terminal 145 is formed of a single layer, the connection terminal 145 may contain a tin-silver solder or copper. However, this is only an example, and the connection terminal 145 is not limited thereto.

At least one of the connection terminals 145 may be disposed in a fan-out region. The fan-out region is defined as a region except for a region in which the electronic component is disposed. That is, the electronic component package 100A according to an example may be a fan-out package. The fan-out package may have reliability greater than that of a fan-in package, may implement a plurality of I/O terminals, and may easily perform 3D interconnection. In addition, since the fan-out package may be mounted on the electronic device without using a separate substrate as compared to a ball grid array (BGA) package, a land grid array (LGA) package, or the like, the fan-out package may be manufactured at a reduced thickness, and may have excellent price competitiveness.

The number, an interval, a disposition form, and the like, of connection terminals 145 are not particularly limited, and may be sufficiently modified depending on design particulars by those skilled in the art. For example, the number of connection terminals 145 may be several ten to several thousand depending on the number of electrode pads 120P of the electronic component 120. However, the number of connection terminals 145 is not limited thereto, and may also be several tens to several thousands or more or several tens to several thousands or less.

The fan-out semiconductor package 100A according to an example may further include an encapsulant 110 encapsulating the electronic component 120. The purpose of the encapsulant 110 may be to protect the electronic component 120. A detailed material of the encapsulant 110 is not particularly limited. For example, an insulating material may be used as a material of the encapsulant 110. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, ABF, FR-4, BT, a PID resin, or the like. In addition, the known molding material such as an epoxy molding compound (EMC), or the like, may also be used.

The encapsulant 110 may contain conductive particles in order to block electromagnetic waves, if necessary. For example, the conductive particle may be any material that may block electromagnetic waves, such as copper (Cu), aluminum (Al), silver (Ag), tin (Sn), gold (Au), nickel (Ni), lead (Pb), solder, or the like, but is not particularly limited thereto.

Figure 13:
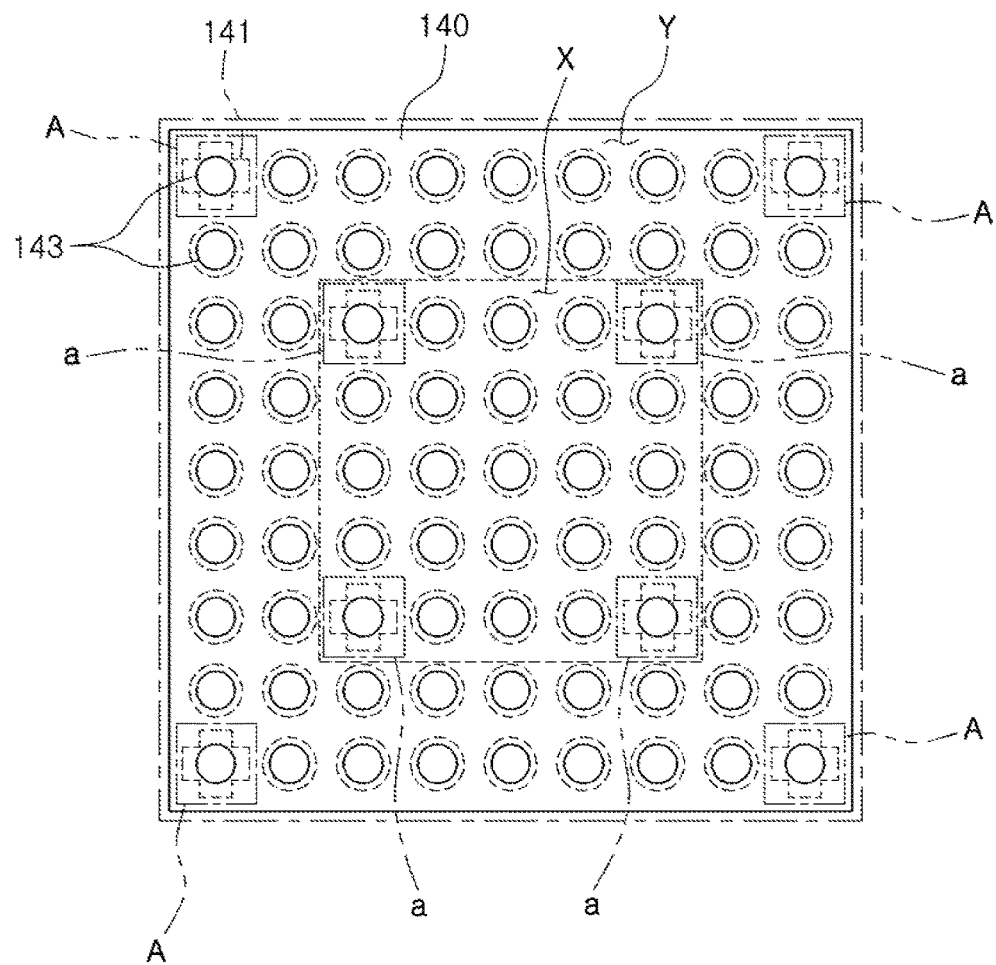
FIG. 13 is a plan view schematically illustrating an example of an array of connection terminal pads.

FIG. 13 is a plan view schematically illustrating an example of an array of connection terminal pads.

Referring to FIG. 13, the passivation layer 140 may include a first region X corresponding to a region in which the electronic component 120 is disposed and a second region Y enclosing the first region X, when viewed from above. Here, corners A of the outermost side of the second region Y may be regions corresponding to the regions R and R' described above. The corners A may be regions in which stress is particularly concentrated on the connection terminals 145 in a case in which the electronic component package 100A is mounted on the main board, as described above. Therefore, in a case in which the connection terminal pads 141 having the non-circular shape as described above are disposed in at least the corners A of the outermost side of the second region Y in order to alleviate stress, the board level reliability of the electronic component package 100A may be improved. The connection terminal pads 141 having the non-circular shape may also be disposed in regions other than the corners A. In addition, corners A of the outermost side of the first region X may also be regions in which stress is concentrated. Therefore, the connection terminal pads 141 having the non-circular shape as described above may also be formed in the corners A. Meanwhile, the outermost side is defined as the outermost region in which the connection terminal pads may be disposed, and an outer side is defined as an outer region including the outermost region. Here, a case in which discrimination between the outer region and an inner region is obscure, that is, an intermediate point between the center and the outermost side, is interpreted as the outer region. In addition, the corner is defined as a corner portion of any region in which the connection terminal pads may be disposed, and a corner side is defined as a corner portion extended from the corner portion so that a predetermined number of connection terminal pads may be further disposed. Meanwhile, a connection terminal pad having a cross shape has been illustrated as an example of the connection terminal pad having the non-circular shape in FIG. 13. However, the connection terminal pad is not limited to having the cross shape, and may have various non-circular shapes as described above.

Figure 14:
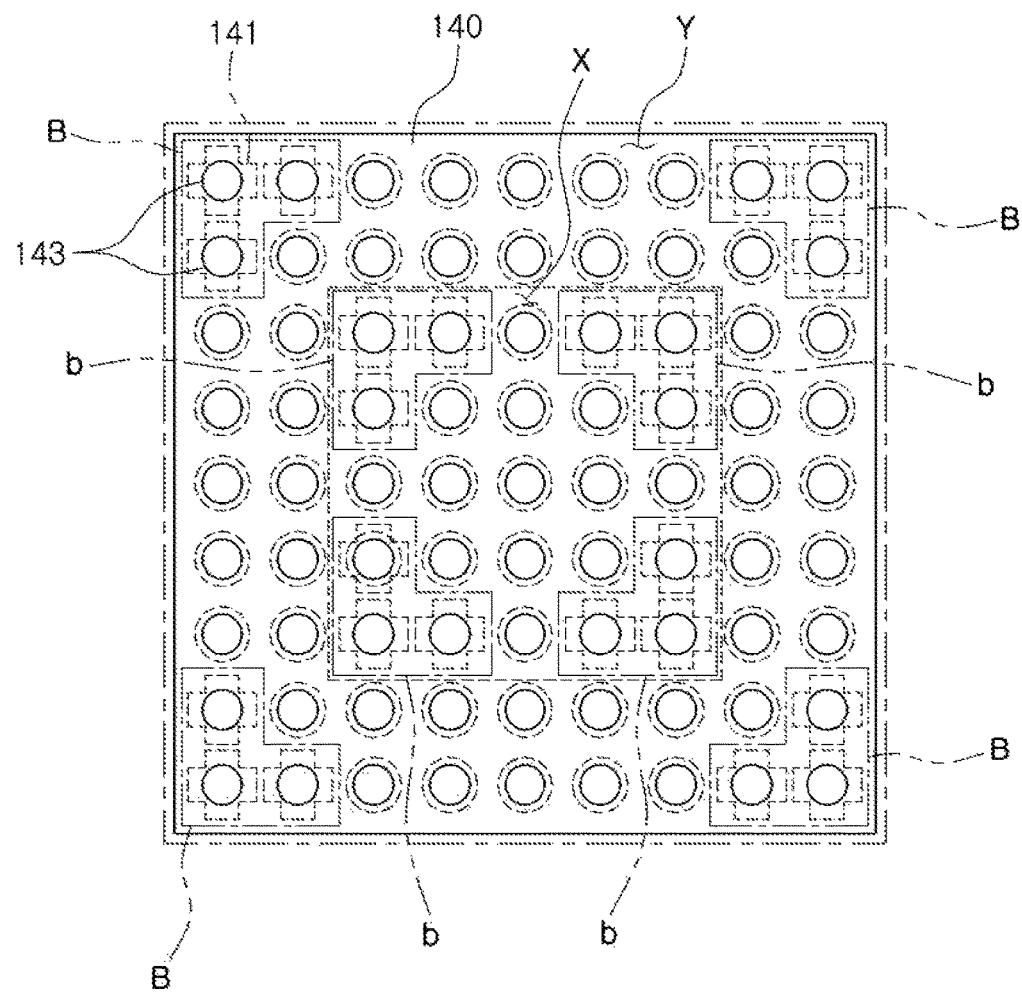
FIG. 14 is a plan view schematically illustrating another example of an array of connection terminal pads.

FIG. 14 is a plan view schematically illustrating another example of an array of connection terminal pads.

Referring to FIG. 14, a passivation layer 140 may include a first region X corresponding to a region in which the electronic component 120 is disposed and a second region Y enclosing the first region X, when viewed from above. Here, corner sides B of the outermost side of the second region Y may be regions corresponding to the regions R and R' described above. The corner sides B may be regions in which stress is particularly concentrated on the connection terminals 145 in the case in which the electronic component package 100A is mounted on the main board, as described above. Therefore, in a case in which the connection terminal pads 141 have the non-circular shape as described above are formed in at least the corner sides B of the outermost side of the second region Y in order to alleviate stress, the board level reliability of the electronic component package 100A may be improved. The connection terminal pads 141 having the non-circular shape may also be disposed in regions other than the corner sides B. In addition, corner sides B of the outermost side of the first region X may also be regions in which stress is concentrated. Therefore, the connection terminal pads 14 having the non-circular shape as described above may also be formed in the corner sides B. Meanwhile, a connection terminal pad having a cross shape has been illustrated as an example of the connection terminal pad having the non-circular shape in FIG. 14. However, the connection terminal pad is not limited to having the cross shape, and may have various non-circular shapes as described above.

Figure 15:
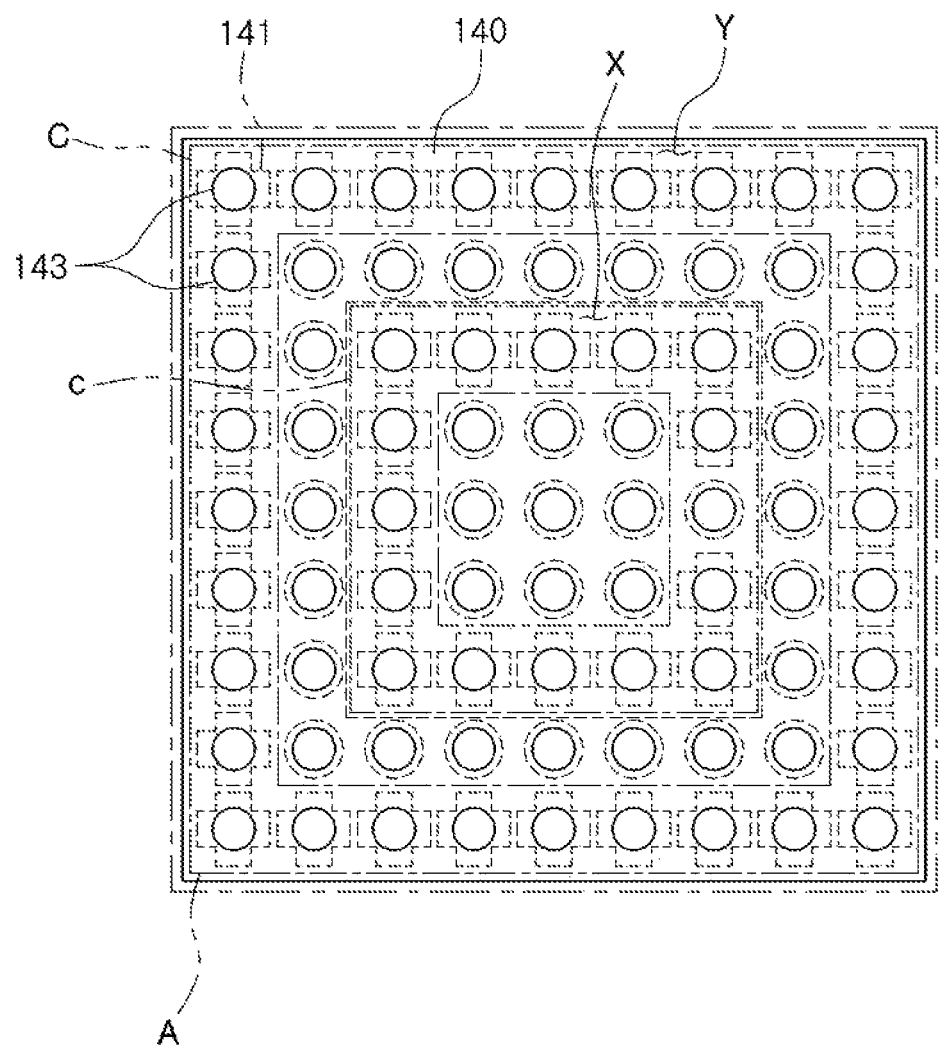
FIG. 15 is a plan view schematically illustrating another example of an array of connection terminal pads.

FIG. 15 is a plan view schematically illustrating another example of an array of connection terminal pads.

Referring to FIG. 15, a passivation layer 140 may include a first region X corresponding to a region in which the electronic component 120 is disposed and a second region Y enclosing the first region X, when viewed from above. Here, the outermost side C of the second region Y may be a region corresponding to the regions R and R' described above. The outermost side C may be a region in which stress is particularly concentrated on the connection terminals 145 in the case in which the electronic component package 100A is mounted on the main board, as described above. Therefore, in a case in which the connection terminal pads 141 having the non-circular shape as described above are formed in at least the outermost side C of the second region Y in order to alleviate stress, the board level reliability of the electronic component package 100A may be improved. The connection terminal pads 141 having the non-circular shape may also be disposed in regions other than the outermost side C. In addition, the outermost side C of the first region X may also be a region in which stress is concentrated. Therefore, the connection terminal pads 14 having the non-circular shape as described above may also be formed in the outermost side C. Meanwhile, a connection terminal pad having a cross shape has been illustrated as an example of the connection terminal pad having the non-circular shape in FIG. 15. However, the connection terminal pad is not limited to having the cross shape, and may have various non-circular shapes as described above.

Figure 16:
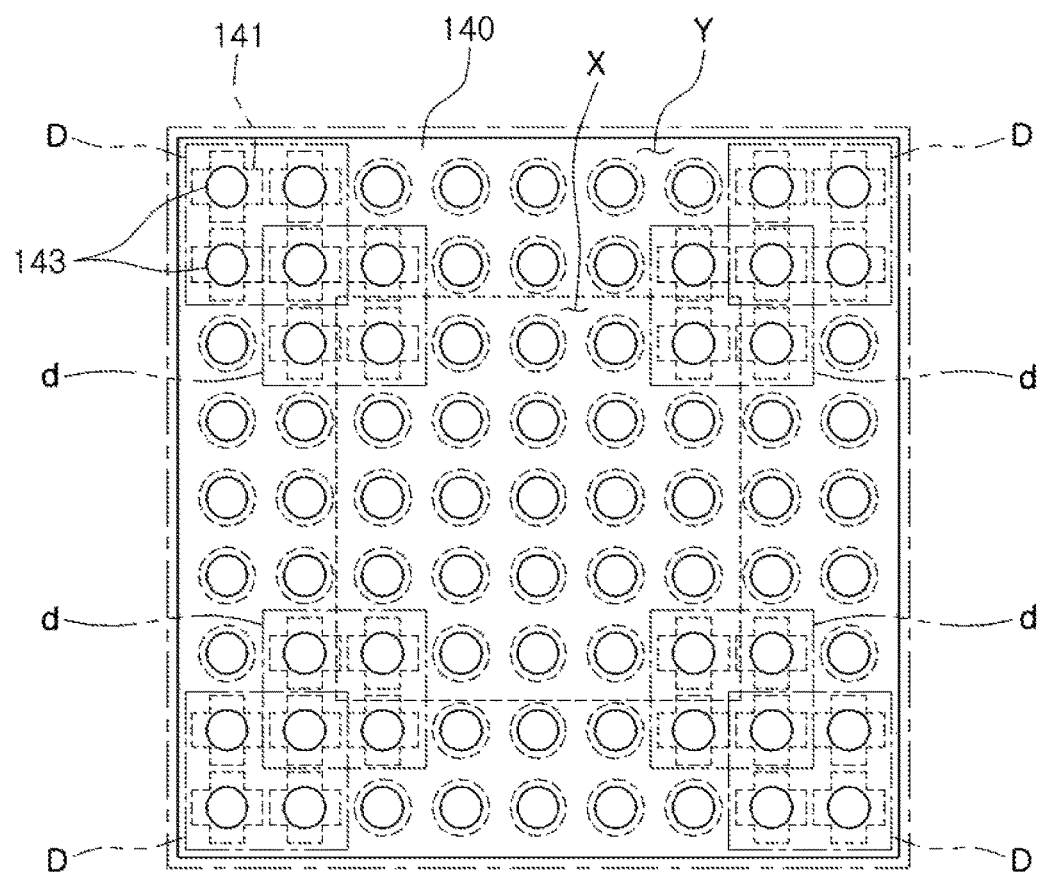
FIG. 16 is a plan view schematically illustrating another example of an array of connection terminal pads.

FIG. 16 is a plan view schematically illustrating another example of an array of connection terminal pads.

Referring to FIG. 16, a passivation layer 140 may include a first region X corresponding to a region in which the electronic component 120 is disposed and a second region Y enclosing the first region X, when viewed from above. Here, corner sides D of an outer side of the second region Y may be regions corresponding to the regions R and R' described above. The corner sides D may be regions in which stress is particularly concentrated on the connection terminals 145 in the case in which the electronic component package 100A is mounted on the main board, as described above. Therefore, in a case in which the connection terminal pads 141 having the non-circular shape as described above are formed in at least the corner sides D of the outer side of the second region Y in order to alleviate stress, the board level reliability of the electronic component package 100A may be improved. The connection terminal pads 141 having the non-circular shape may also be disposed in regions other than the corner sides D. In addition, in the case in which the electronic component package 100A is mounted on the main board, stress may also be further concentrated on the connection terminals 145 in the corners of the outermost side of the first region X and portions d of the second region Y enclosing the corners of the outermost side of the first region X in which a plurality of heterogeneous materials meet each other. Therefore, the connection terminal pads 141 having the non-circular shape as described above may also be formed in the corners of the outermost side of the first region X and the portions D of the second region Y enclosing the corners of the outermost side of the first region X. Meanwhile, a connection terminal pad having a cross shape has been illustrated as an example of the connection terminal pad having the non-circular shape in FIG. 16. However, the connection terminal pad is not limited to having the cross shape, and may have various non-circular shapes as described above.

Figure 17:
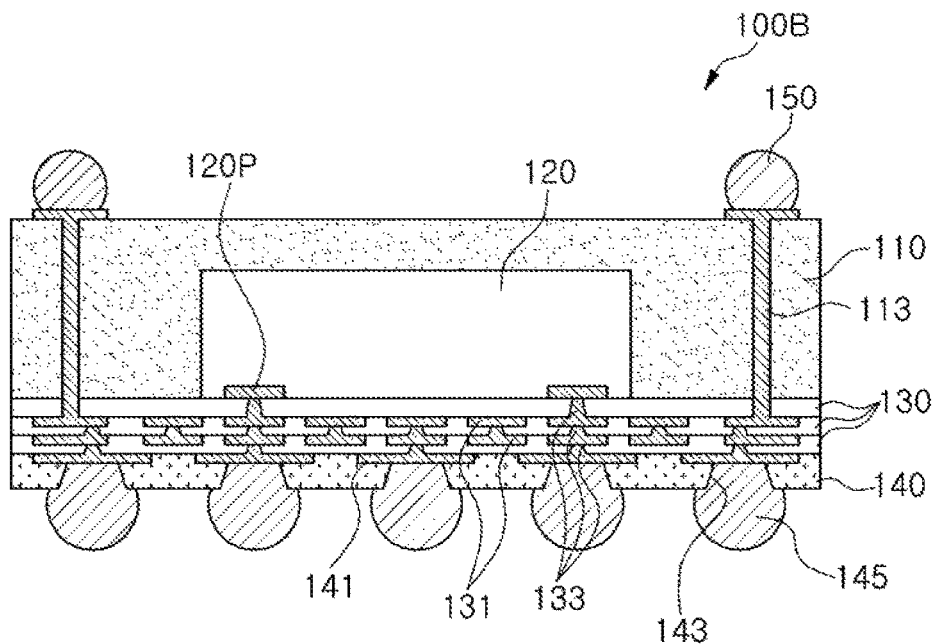
FIG. 17 is a cross-sectional view schematically illustrating another example of a fan-out semiconductor package.

FIG. 17 is a cross-sectional view schematically illustrating another example of a fan-out semiconductor package.

Referring to FIG. 17, a fan-out semiconductor package 100B according to another example may be a package-on-package (PoP) type. That is, the electronic component package 100B according to another example may further include through-wirings 113 penetrating through the encapsulant 110. In addition, the electronic component package 100B may further include connection terminals 150 connected to the through-wirings 113. The other components are the same as the components as described above.

The through-wirings 113 may serve to electrically connect another package, a surface-mounting technology (SMT) component, and the like, and the electrical component 120 to each other when another package, a surface-mounting technology (SMT) component, and the like, are disposed on the electronic component package 100B. A conductive material such as copper (Cu), aluminum (Al), silver (Ag), tin (Sn), gold (Au), nickel (Ni), lead (Pb), titanium (Ti), or alloys thereof, may be used as a material of the through-wiring 113. The number, an interval, a disposition form, and the like, of through-wirings 113 are not particularly limited, and may be sufficiently modified depending on design particulars by those skilled in the art. Therefore, a detailed description of the through-wirings 113 will be omitted.

The connection terminals 150 may serve as connection terminals connecting the electronic component package 100B to another package, and the like, when another package, and the like, are disposed on the electronic component package 100B. The connection terminal 150 may be formed of a conductive material, such as copper (Cu), aluminum (Al), silver (Ag), tin (Sn), gold (Au), nickel (Ni), lead (Pb), solder, or the like, but is not particularly limited thereto. The connection terminal 150 may be a land, a ball, a pin, or the like. However, the connection terminal 150 may generally be a solder ball. The connection terminal 150 may be formed of multiple layers or a single layer. In a case in which the connection terminal 150 is formed of multiple layers, the connection terminal 150 may contain a copper pillar and a solder, and in a case in which the connection terminal 150 is formed of a single layer, the connection terminal 150 may contain a tin-silver solder or copper. However, this is only an example, and the connection terminal 150 is not limited thereto.

Figure 18:
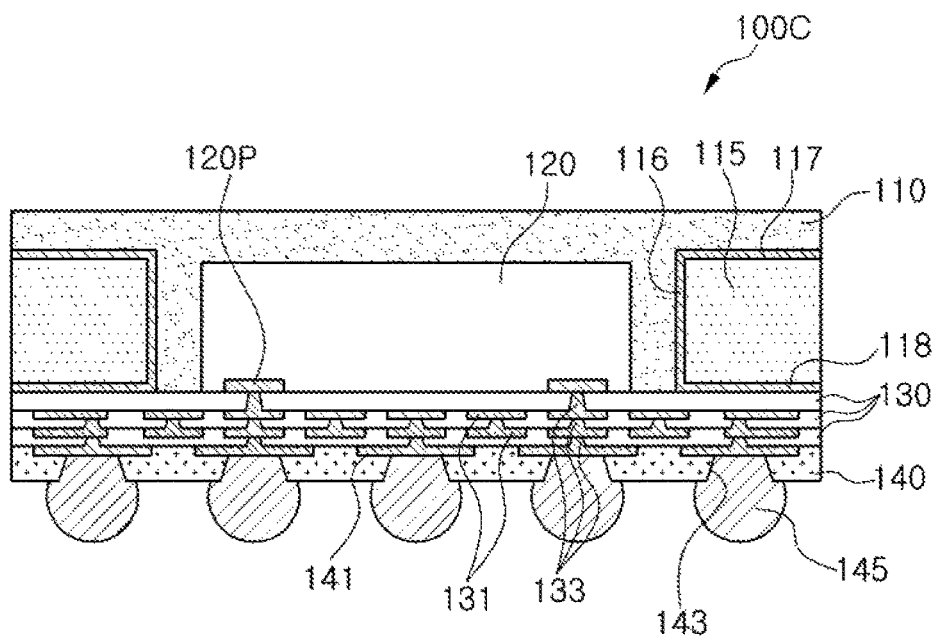
FIG. 18 is a cross-sectional view schematically illustrating another example of a fan-out semiconductor package.

FIG. 18 is a cross-sectional view schematically illustrating another example of a fan-out semiconductor package.

Referring to FIG. 18, a fan-out semiconductor package 100C according to another example may be a panel level package (PLP) type. That is, the electronic component package 100C according to anther example may further include a second interconnection member 115 disposed on the first interconnection member 130 and having a through-hole. Here, the electronic component 120 may be disposed in the through-hole of the second interconnection member 115. In addition, the encapsulant 110 may be provided on the other sides of the second interconnection member 115 and the electronic component 120 and in the through-hole. Metal layers 116, 117, and 118 may be disposed on an inner surface of the through-hole of the second interconnection member 115, an upper surface of the second interconnection member 115, and/or a lower surface of the second interconnection member 115, if necessary. The other components are the same as the components as described above.

The purpose of the second interconnection member 115 may be to support the electronic component package 100C, and rigidity of the electronic component package 100C may be maintained and uniformity of a thickness of the electronic component package 100C may be secured by the second interconnection member. The frame 115 may have an upper surface and a lower surface opposing the upper surface. Here, the through-hole may penetrate between the upper surface and the lower surface. The electronic component 120 may be disposed in the through-hole so as to be spaced apart from the second interconnection member 115. As a result, the surrounding of side surfaces of the electronic component 120 may be enclosed by the second interconnection member 115. A material of the second interconnection member 115 is not particularly limited as long as the second interconnection member may support the electronic component package. For example, an insulating material may be used as a material of the second interconnection member 115. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, ABF, FR-4, BT, or the like. Alternatively, a metal having excellent rigidity and thermal conductivity may be used as a material of the second interconnection member 115. Here, the metal may be an Fe—Ni based alloy. In this case, a Cu plating may also be formed on a surface of the Fe—Ni based alloy in order to secure adhesion between the Fe—Ni based alloy and a molding material, an interlayer insulating material, or the like. In addition to the materials as described above, glass, ceramic, plastic, or the like, may also be used as a material of the second interconnection member 115. A thickness of the second interconnection member 115 in a cross section thereof is not particularly limited, and may be designed depending on a thickness of the electronic component 120 in a cross section thereof. For example, a thickness of the second interconnection member 115 in the cross section thereof may be about 100 µm to 500 µm.

The purpose of the metal layers 116, 117, and 118 disposed on the inner surface of the through-hole of the second interconnection member 115, the upper surface of the second interconnection member 115, and/or the lower surface of the second interconnection member 115, if necessary, may be to improve heat radiation characteristics and/or block electromagnetic waves. A material of the metal layers 116, 117, and 118 is not particularly limited as long as it is a metal having high thermal conductivity, such as copper (Cu), aluminum (Al), silver (Ag), tin (Sn), gold (Au), nickel (Ni), lead (Pb), titanium (Ti), or alloys thereof. Heat emitted from the electronic component 120 may be dispersed to an upper side or a lower side of the second interconnection member 115 through the metal layers 116, 117, and 118 by conduction, radiation, or convection.

Figure 19:
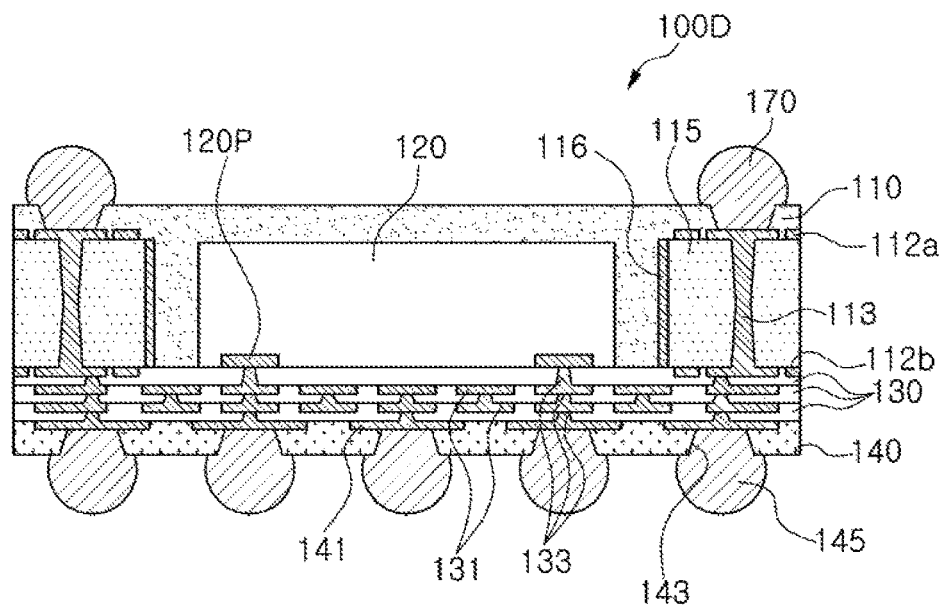
FIG. 19 is a cross-sectional view schematically illustrating another example of a fan-out semiconductor package.

FIG. 19 is a cross-sectional view schematically illustrating another example of a fan-out semiconductor package.

Referring to FIG. 19, a fan-out semiconductor package 100D according to another example may be a package-on-package (PoP) type while being a panel level package (PLP) type. That is, the electronic component package 100D according to another example may further include through-wirings 113 penetrating through the second interconnection member 115. Here, various patterns 112a and 112b may be disposed on an upper surface and a lower surface of the second interconnection member 115, and a metal layer 116 may be disposed on an inner surface of the through-hole, if necessary. In addition, the electronic component package 100D may further include connection terminals 170 connected to the through-wirings 113. The other components are the same as the components as described above.

The through-wirings 113 may penetrate through only the second interconnection member 115, and the number, an interval, a disposition form, and the like, of through-wirings 113 are not particularly limited, and may be sufficiently modified depending on design particulars by those skilled in the art. The connection terminals 170 may be disposed in upper opening parts (not denoted by a reference numeral) formed in an upper surface of the encapsulant 110, and the number, an interval, a disposition form, and the like, of connection terminals 170 are not particularly limited, and may be sufficiently modified depending on design particulars by those skilled in the art. The various redistribution layers 112a and 112b disposed on the upper surface and the lower surface of the second interconnection member 115 may be redistribution patterns and/or pad patterns. Since the redistribution layers may also be formed on the upper surface and the lower surface of the second interconnection member 115, as described above, a wider routing region may be provided to the electronic component package 100D. As a result, a degree of freedom of a design of the first interconnection member 130 may be further improved. The purpose of the metal layer 116 disposed on the inner surface of the through-hole of the second interconnection member 115, if necessary, may be to improve heat radiation characteristics and/or block electromagnetic waves. In a case in which the metal layer 116 is disposed on only the inner surface of the through-hole as described above, a heat radiation effect and an electromagnetic wave blocking effect may be sufficiently accomplished.

Figure 20:
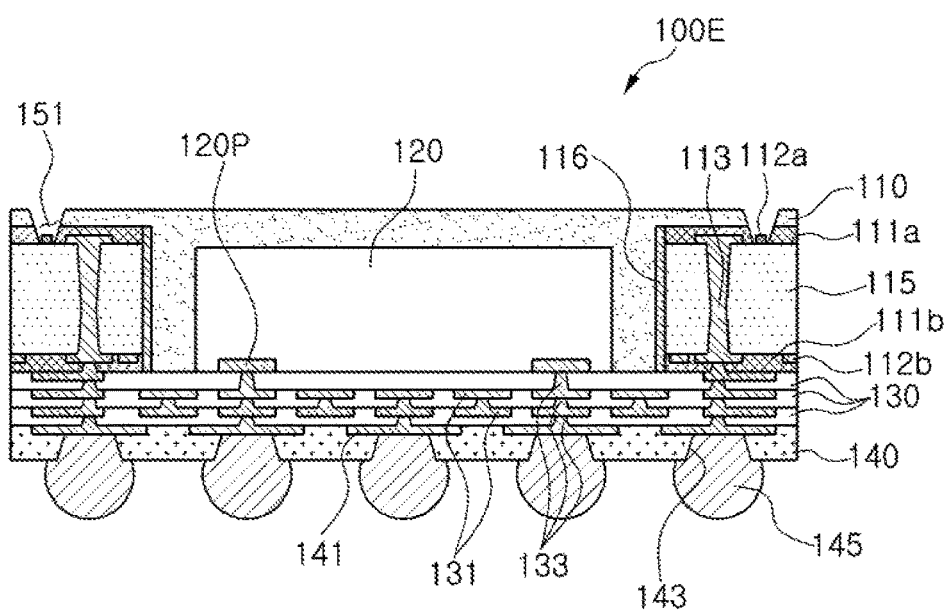
FIG. 20 is a cross-sectional view schematically illustrating another example of a fan-out semiconductor package.

FIG. 20 is a cross-sectional view schematically illustrating another example of a fan-out semiconductor package.

Referring to FIG. 20, a fan-out semiconductor package 100E according to another example may be modified from the electronic component package 100D. That is, insulating layers 111a and 111b having through-holes integrated with a through-hole of a second interconnection member 115 may be further disposed on an upper surface and/or a lower surface of the second interconnection member 115. An insulating layer 111a may have upper opening parts 151 formed therein so as to penetrate up to the encapsulant 110, and portions of the pattern 112a may be externally exposed through the upper opening parts 151. The exposed pattern 112a may serve as pads of wire bonding of another electronic component and another electronic component package disposed on the electronic component package 100E. In this case, the number of layers of the first interconnection member may be reduced depending on a redistribution layer 112b, and thus a reduction in a yield due to a process defect may be prevented. The other components are the same as the components as described above.

The purpose of the insulating layers 111a and 111b may be to form more redistribution layers before the electronic component 120 is disposed. As the number of insulating layers 111a and 111b is increased, more redistribution layers may be formed on the corresponding layers, and thus the number of layers in the first interconnection member may be reduced. As a result, the probability that the electronic component 120 will not be used due to a defect occurring in a process of forming the first interconnection member after the electronic component 120 is disposed may be reduced. That is, a problem that a yield is reduced due to a process defect after the electronic component 120 is disposed may be prevented. Through-holes penetrating through the insulating layers 111*a* and 111*b* may also be formed in the insulating layers 111*a* and 111*b*, and may be integrated with the through-hole penetrating through the second interconnection member 115. In this case, the electronic component 120 may be disposed in the integrated through-hole. Various patterns and vias (not denoted by a reference numeral) may also be formed on the insulating layers 111*a* and 111*b*.

An insulating material may be used as materials of the insulating layers 111*a* and 111*b*. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, ABF, FR-4, BT, or the like. In a case in which a photosensitive insulating material such as a photosensitive insulating resin is used as materials of the insulating layers 111*a* and 111*b*, the insulating layers 111*a* and 111*b* may be formed at a reduced thickness, and a fine pitch may be easily implemented. The respective insulating layers 111*a* and 111*b* may contain the same insulating material or different insulating materials. In addition, the insulating layers 111*a* and 111*b* may have approximately the same thickness or different thicknesses. In a case in which materials of the insulating layers 111*a* and 111*b* are the same as each other, thicknesses of the insulating layers 111*a* and 111*b* are approximately the same as each other, and the numbers of insulating layers 111*a* and 111*b* are the same as each other, the insulating layers 111*a* and 111*b* may be symmetrical to each other in relation to the second interconnection member 115, which may be more easy in controlling warpage.

Figure 21:
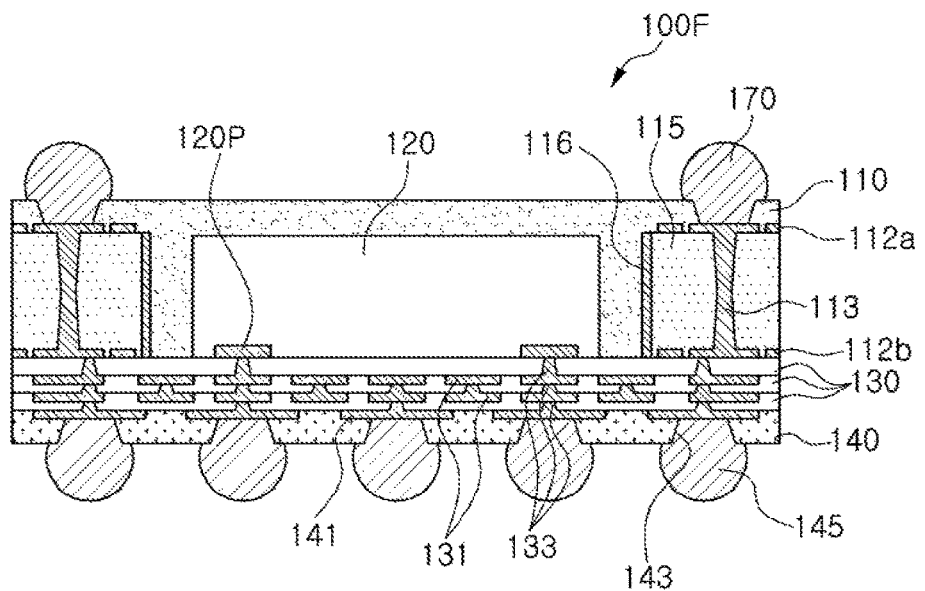
FIG. 21 is a cross-sectional view schematically illustrating another example of a fan-out semiconductor package.

FIG. 21 is a cross-sectional view schematically illustrating another example of a fan-out semiconductor package.

Referring to FIG. 21, a fan-out semiconductor package 100F according to another example may be modified from the electronic component package 100D. That is, a pattern 112*b* formed on a lower surface of a second interconnection member 115 may be embedded in the second interconnection member 115 so that one surface thereof is exposed. In this case, a thickness of the pattern 112*b* formed on the lower surface of the second interconnection member 115 may be ignorable. Therefore, vias 133 of the first interconnection members 130, 131, 141, 142, and 133 connected to the electrode pads 120P of the electronic component 120 may be formed at a more reduced thickness. As a result, a fine pitch may be implemented. The other components are the same as the components as described above.

Figure 22:
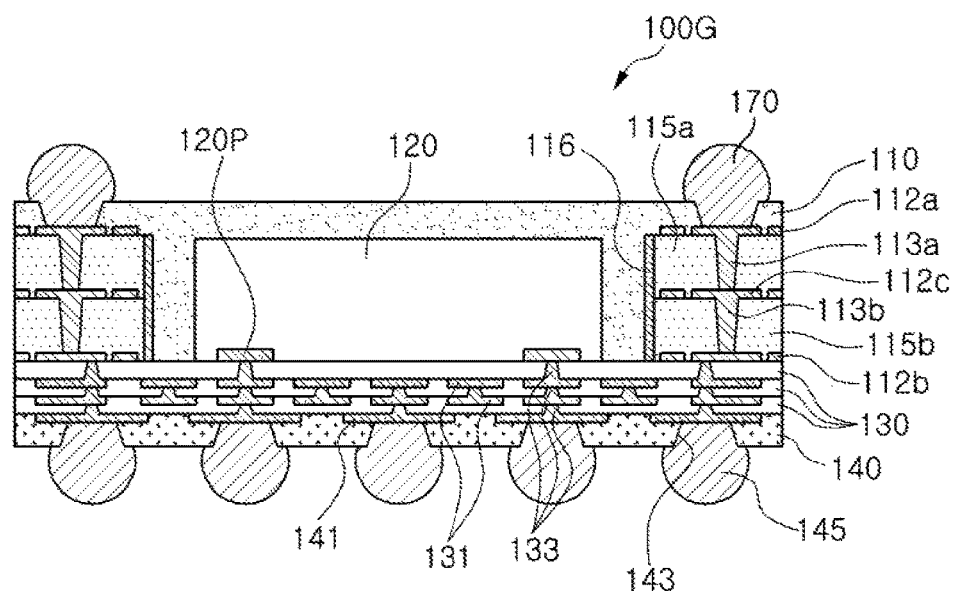
FIG. 22 is a cross-sectional view schematically illustrating another example of a fan-out semiconductor package.

FIG. 22 is a cross-sectional view schematically illustrating another example of a fan-out semiconductor package.

Referring to FIG. 22, a fan-out semiconductor package 100G according to another example may be modified from the electronic component package 100F. That is, frames 115*a* and 115*b* may be formed of multiple layers. In this case, a pattern 112*c* may also be disposed in the second interconnection members 115*a* and 115*b*. The pattern 112*c* disposed in the second interconnection members 115*a* and 115*b* may be electrically connected to patterns 112*a* and 112*b* disposed at both sides of the second interconnection members 115*a* and 115*b* through vias 113*a* and 113*b*. In this case, patterns that are to be formed on the first interconnection members 130, 131, 141, 142, and 133 may be formed on the second interconnection members 115*a* and 115*b*, and thus the number of layers of the first interconnection members 130, 131, 141, 142, and 133 may be reduced. In addition, a degree of freedom of a design of the first interconnection members 130, 131, 141, 142, and 133 may be increased. Further, a process defect occurring at the time of manufacturing the first interconnection members 130, 131, 141, 142, and 133 may be reduced, and thus a yield may be improved. The other components are the same as the components as described above.

Figure 23:
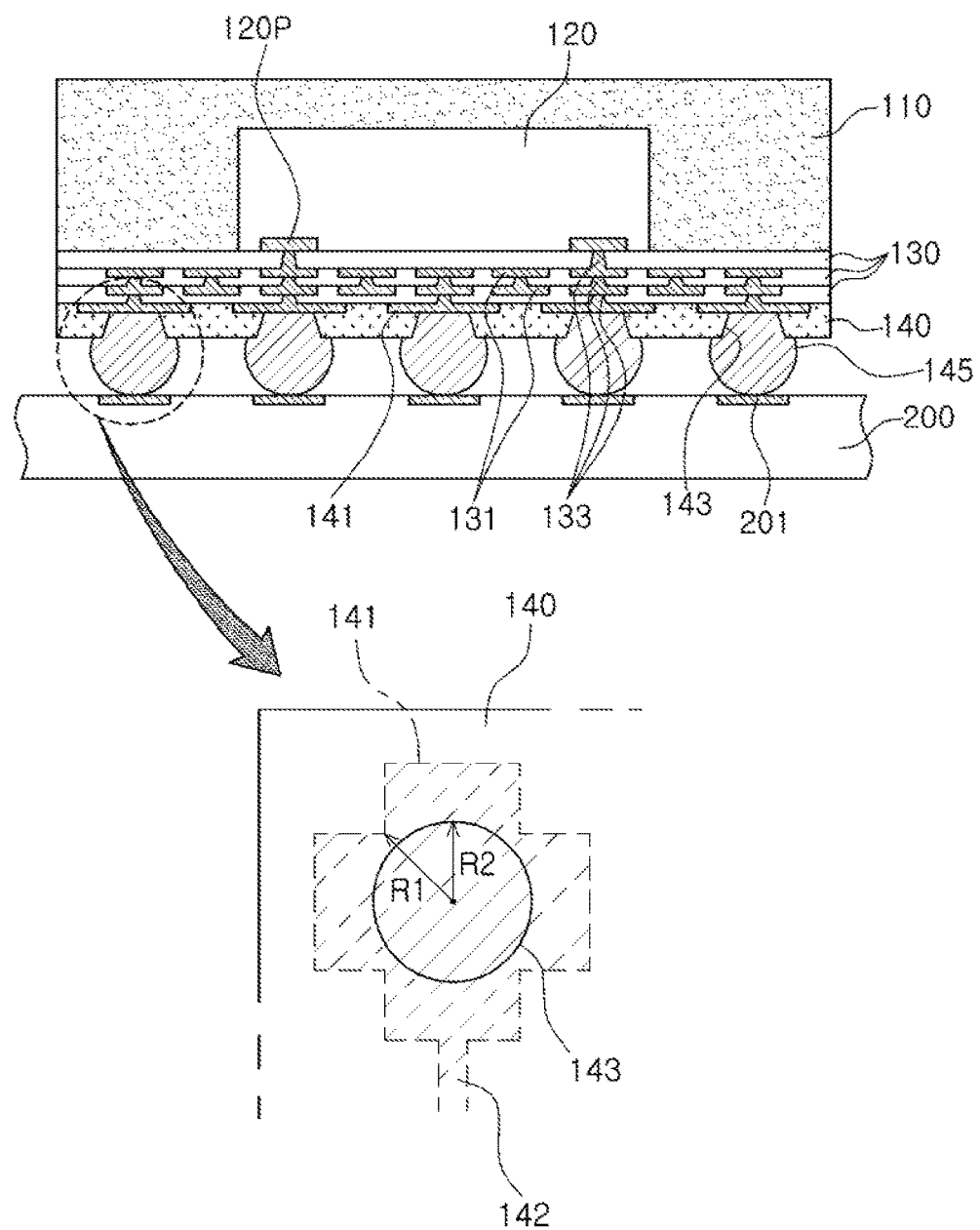
FIG. 23 is a cross-sectional view schematically illustrating a case in which a fan-out semiconductor package according to an example is mounted on a circuit board.

FIG. 23 is a cross-sectional view schematically illustrating a case in which a fan-out semiconductor package according to an example is mounted on a circuit board.

Referring to FIG. 23, a board 200 may have mounting pads 201 on which a fan-out semiconductor package is mounted. The fan-out semiconductor package may be the electronic component packages 100A to 100E described above. Here, in the electronic component package, the connection terminal pads 141 disposed in at least the regions R and R' in which stress is concentrated among the connection terminal pads 141 may have a plurality of protrusion parts 141P and may be implemented in the non-circular shape, for example, a shape having the plurality of protrusion parts 141P. Therefore, stress may be alleviated. As a result, even in the case in which warpage is generated in the electronic component package and the main board due to the difference between the CTE of the electronic component and the main board, the generation of cracks in the connection terminals 145 may be prevented. The connection terminal pads 141 disposed in other regions may also have the plurality of protrusion parts 141P.

Figure 24:
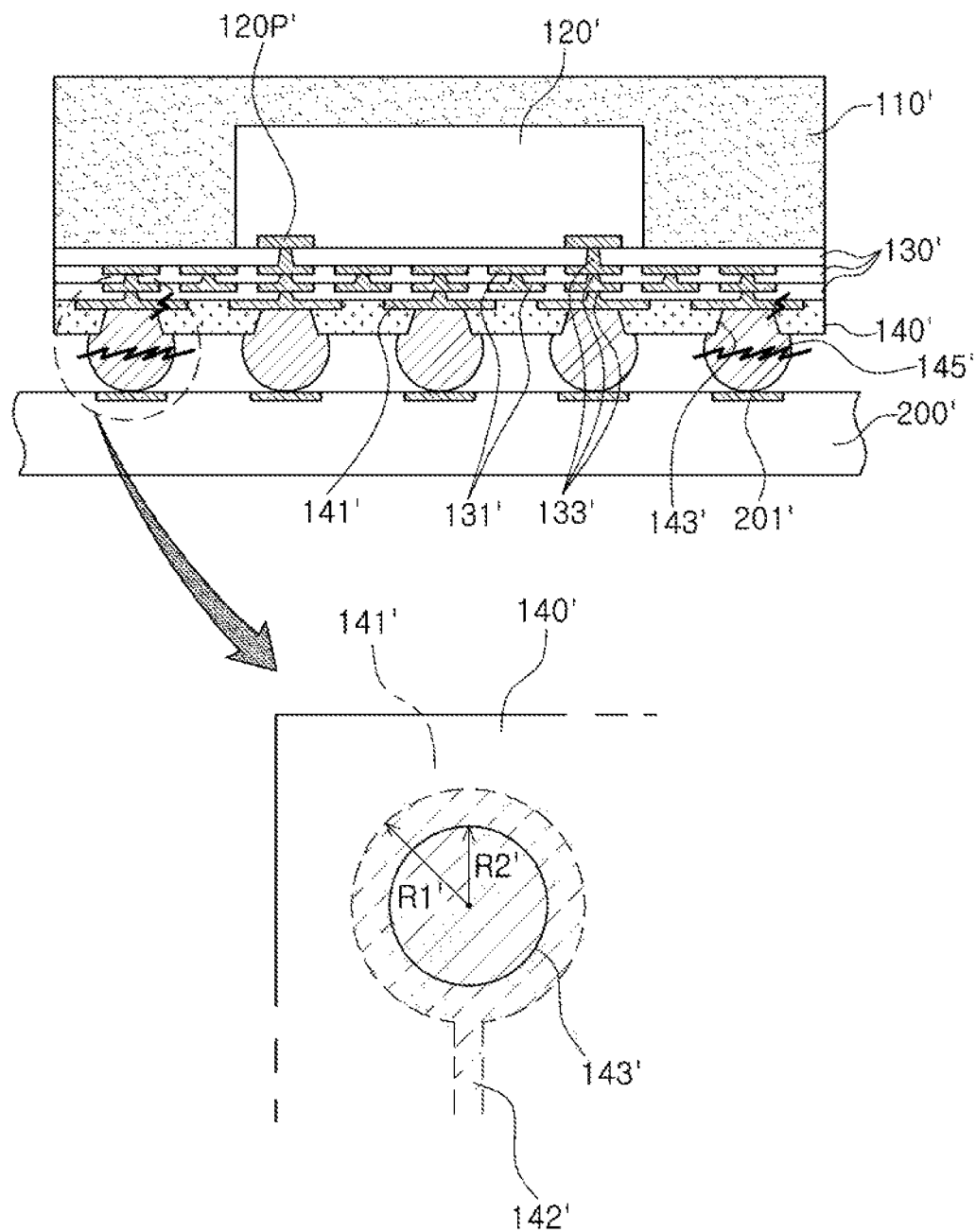
FIG. 24 is a cross-sectional view schematically illustrating a case in which a fan-out semiconductor package having only circular connection terminal pads is mounted on a circuit board.

FIG. 24 is a cross-sectional view schematically illustrating a case in which a fan-out semiconductor package having only circular connection terminal pads is mounted on a circuit board.

Referring to FIG. 24, a board 200' may have mounting pads 201' on which a fan-out semiconductor package is mounted. Here, the electronic component package may include an electronic component 120', redistribution layers 130', 131', 133', 141', and 142', a passivation layer 140', connection terminals 145', an encapsulant 110', and the like, similar to the electronic component packages 100A to 100G described above. However, all of the connection terminal pads 141' may be simply implemented in a circular shape. Therefore, in the case in which warpage is generated in the electronic component package and the main board due to the difference between the CTE of the electronic component and the main board, stress may be concentrated, and thus generation of cracks in the connection terminals 145' may not be prevented. In addition, this stress may also be transferred to the connection terminal pads 141', and thus cracks may be generated in the connection terminal pads 141'. Therefore, board level reliability may be reduced.

As set forth above, according to an exemplary embodiment in the present disclosure, a fan-out semiconductor package of which board level reliability is improved, and an electronic device including the same, may be provided.

Meanwhile, in the present disclosure, a word "connected" is a concept including a case in which any component is indirectly connected to another component by an adhesive, or the like, as well as a case in which any component is directly connected to another component. In addition, a word "electrically connected" is a concept including both of a case in which any component is physically connected to another component and a case in which any component is not physically connected to another component.

In addition, in the present disclosure, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

In addition, a term "example" used in the present disclosure does not mean the same exemplary embodiment, but is provided in order to emphasize and describe different unique features. However, the above suggested examples may also be implemented to be combined with a feature of another example. For example, even though particulars described in a specific example are not described in another example, it may be understood as a description related to another example unless described otherwise.

In addition, terms used in the present disclosure are used only in order to describe an exemplary embodiment rather than limiting the present disclosure. Here, singular forms include plural forms unless interpreted otherwise in a context.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a semiconductor chip;
   a first interconnection member stacking on the semiconductor chip, electrically connected to the semiconductor chip, and having a connection terminal pad; and
   a passivation layer disposed at one side of the first interconnection member and having an opening part opening a portion of the connection terminal pad,
   wherein distances from a center of the connection terminal pad to at least two points of an edge thereof are different from each other, and
   the center of the connection terminal pad and the at least two points of the edge are positioned in a plane vertical to a stacking direction of the first interconnection member and the semiconductor chip.

2. The semiconductor package of claim 1, wherein R1≥R2 in which R1 is a shortest distance from the center of the connection terminal pad to the edge of the connection terminal pad and R2 is a longest distance from the center of the connection terminal pad to an edge of the opening part.

3. The semiconductor package of claim 1, wherein the connection terminal pad has a plurality of protrusion parts protruding in different directions on the plane vertical to the stacking direction of the first interconnection member and the semiconductor chip.

4. The semiconductor package of claim 3, wherein end portions of the plurality of protrusion parts are covered by the passivation layer.

5. The semiconductor package of claim 1, wherein the connection terminal pad has a polygonal shape in the plane vertical to the stacking direction of the first interconnection member and the semiconductor chip.

6. The semiconductor package of claim 5, wherein a plurality of angled parts of the connection terminal pad are covered by the passivation layer.

7. The semiconductor package of claim 1, wherein the opening part has a circular shape in the plane vertical to the stacking direction of the first interconnection member and the semiconductor chip.

8. The semiconductor package of claim 1, wherein the passivation layer includes a first region corresponding to a region in which the semiconductor chip is disposed and a second region enclosing the first region, and
   the connection terminal pad is disposed in any one of a corner of an outermost side of the first region and a corner of an outermost side of the second region.

9. The semiconductor package of claim 1, wherein the passivation layer includes a first region corresponding to a region in which the semiconductor chip is disposed and a second region enclosing the first region, and
   the connection terminal pad is disposed in any one of a corner side of an outermost side of the first region and a corner side of an outermost side of the second region.

10. The semiconductor package of claim 1, wherein the passivation layer includes a first region corresponding to a region in which the semiconductor chip is disposed and a second region enclosing the first region, and
    the connection terminal pad is disposed in any one of an outermost side of the first region and an outermost side of the second region.

11. The semiconductor package of claim 1, wherein the passivation layer includes a first region corresponding to a region in which the semiconductor chip is disposed and a second region enclosing the first region, and
    the connection terminal pad is disposed in a corner side of an outer side of the second region.

12. The semiconductor package of claim 1, wherein the passivation layer includes a first region corresponding to a region in which the semiconductor chip is disposed and a second region enclosing the first region, and
    the connection terminal pad is disposed in a corner of an outermost side of the first region and a portion of the second region enclosing the corner of the outermost side of the first region.

13. The semiconductor package of claim 1, further comprising a connection terminal disposed in the opening part of the passivation layer and connected to the connection terminal pad,
    wherein the connection terminal is a solder ball, the connection terminal pad is a solder ball pad, and the passivation layer is a solder resist layer.

14. The semiconductor package of claim 1, further comprising a second interconnection member disposed on the first interconnection member and having a through-hole,
    wherein the semiconductor chip is disposed in the through-hole of the second interconnection member.

15. The semiconductor package of claim 14, further comprising an encapsulant encapsulating the semiconductor chip,
    wherein the encapsulant is provided on the other sides of the second interconnection member and the semiconductor chip and in the through-hole.

16. The semiconductor package of claim 14, further comprising first and second conductive patterns disposed on opposite surfaces of the second interconnection member, respectively,
    wherein the first and second conductive patterns are electrically connected to each other through a through-wiring in the second interconnection member, and are electrically connected to the connection terminal pad.

17. The semiconductor package of claim 14, further comprising a first conductive pattern embedded in the second interconnection member and having one surface exposed by the second interconnection member, and a second conductive pattern disposed on the second interconnection member and opposing the first conductive pattern,
    wherein the first and second conductive patterns are electrically connected to each other through a through-wiring in the second interconnection member, and are electrically connected to the connection terminal pad.

18. The semiconductor package of claim 14, wherein the second interconnection member includes a lower layer and an upper layer stacking on each other,
- a first conductive pattern is embedded in the lower layer and having one surface exposed by the lower layer,
- a second conductive pattern is disposed on the first layer and opposes the first conductive pattern,
- the upper layer covers the second conductive pattern,
- a third conductive pattern is disposed on the second layer, and
- the first to third conductive patterns are electrically connected to each other through through-wirings in the first layer and the second layer, and are electrically connected to the connection terminal pad.

19. An electronic device comprising:
a board; and
the semiconductor package of claim 1 mounted on the board.

20. A semiconductor package comprising:
a semiconductor chip;
an interconnection member stacking on the semiconductor chip and electrically connected to the semiconductor chip, and including a connection terminal pad having a non-circular shape in a plane vertical to a stacking direction of the interconnection member and the semiconductor chip, and a redistribution layer having a width smaller than that of the connection terminal pad, directly connected to the connection terminal pad, and extending in the plane vertical to the stacking direction of the interconnection member and the semiconductor chip; and
a passivation layer disposed at one side of the interconnection member and having an opening part exposing a center portion of the non-circular shape of the connection terminal pad,
wherein the passivation layer cover a remaining portion of the non-circular shape of the connection terminal pad other than the center portion thereof.

21. The semiconductor package of claim 20, wherein the opening part only exposes the connection terminal pad.

22. The semiconductor package of claim 21, wherein the opening part has a circular shape in the plane vertical to the stacking direction of the first interconnection member and the semiconductor chip.

* * * * *